(12) United States Patent
Pusche et al.

(10) Patent No.: US 11,287,249 B2
(45) Date of Patent: Mar. 29, 2022

(54) WAFER SURFACE CURVATURE DETERMINING SYSTEM

(71) Applicant: SOITEC BELGIUM, Hasselt (BE)

(72) Inventors: Roland Pusche, Kettenis (BE); Stefan Degroote, Scherpenheuvel-Zichem (BE); Joff Derluyn, Sint-Joris-Weert (BE)

(73) Assignee: SOITEC BELGIUM, Hasselt (BE)

( * ) Notice: Subject to any disclaimer, the term of this patent is extended or adjusted under 35 U.S.C. 154(b) by 0 days.

(21) Appl. No.: 16/957,031

(22) PCT Filed: Dec. 20, 2018

(86) PCT No.: PCT/EP2018/086214
§ 371 (c)(1),
(2) Date: Jun. 22, 2020

(87) PCT Pub. No.: WO2019/122137
PCT Pub. Date: Jun. 27, 2019

(65) Prior Publication Data
US 2020/0393241 A1    Dec. 17, 2020

(30) Foreign Application Priority Data

Dec. 21, 2017 (EP) ..................................... 17209765

(51) Int. Cl.
*G01B 11/255*     (2006.01)
*G01B 11/30*      (2006.01)
(Continued)

(52) U.S. Cl.
CPC .......... *G01B 11/255* (2013.01); *G01B 11/306* (2013.01); *G01N 21/9501* (2013.01); *G01N 21/956* (2013.01)

(58) Field of Classification Search
CPC ............. G01N 21/9501; G01N 21/956; G01B 11/0625; G01B 11/255; G01B 11/306;
(Continued)

(56) References Cited

U.S. PATENT DOCUMENTS 5,134,303 A * 7/1992 Blech ..................... G01B 11/16
                                                                250/226
8,502,979 B2    8/2013 Levy et al.
(Continued)

OTHER PUBLICATIONS

Extended European Search Report from corresponding EP Application No. EP17209765.1, dated Feb. 20, 2018.
(Continued)

*Primary Examiner* — Tri T Ton
(74) *Attorney, Agent, or Firm* — Workman Nydegger

(57) ABSTRACT

A system for in-situ measurement of a curvature of a surface of a wafer comprises: a multiwavelength light source module, adapted to emit incident light comprising a plurality of wavelengths; an optical setup configured to combine the incident light into a single beam and to guide the single beam towards a surface of a wafer such that the single beam hits the surface at a single measuring spot on the surface; and a curvature determining unit, configured to determine a curvature of the surface of the wafer from reflected light corresponding to the single beam being reflected on the surface at the single measuring spot.

10 Claims, 13 Drawing Sheets

(51) Int. Cl.
*G01N 21/95* (2006.01)
*G01N 21/956* (2006.01)

(58) Field of Classification Search
CPC .. G01B 2210/42; G01B 2210/48; H01L 22/12
USPC ..... 356/239.1–239.8, 237.1–237.6, 600–613
See application file for complete search history.

(56) References Cited

U.S. PATENT DOCUMENTS

| | | | |
|---|---|---|---|
| 2006/0092417 A1* | 5/2006 | Schwarz | G01N 21/8806 |
| | | | 356/337 |
| 2007/0030493 A1* | 2/2007 | Zettler | G01B 11/24 |
| | | | 356/612 |
| 2007/0146685 A1 | 6/2007 | Yoo et al. | |
| 2010/0302551 A1 | 12/2010 | Akamatsu et al. | |
| 2013/0021610 A1* | 1/2013 | Zettler | H01L 22/12 |
| | | | 356/369 |

OTHER PUBLICATIONS

International Search Report and Written Opinion from PCT Application No. PCT/EP2018/086214, dated May 6, 2019.

\* cited by examiner

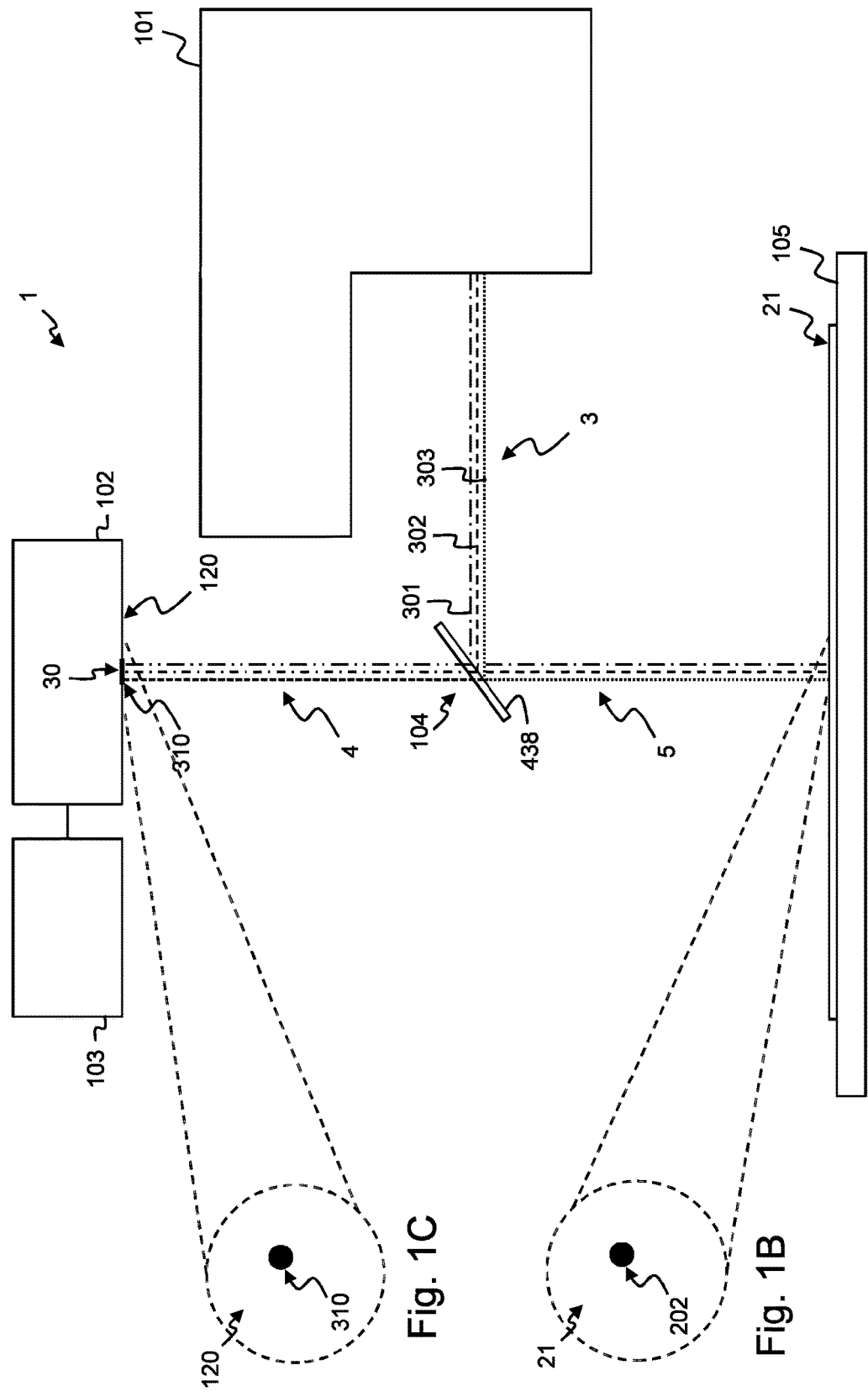

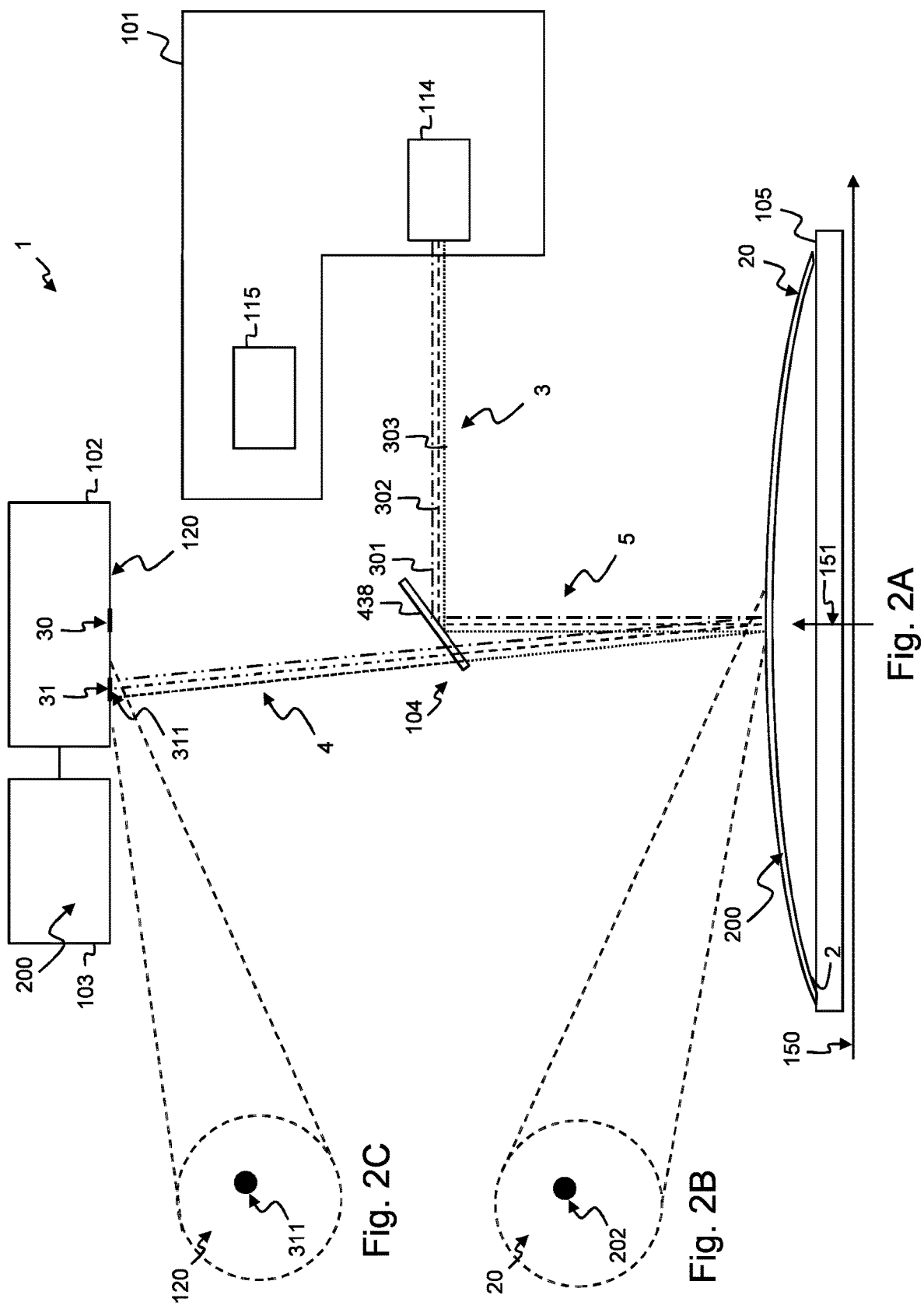

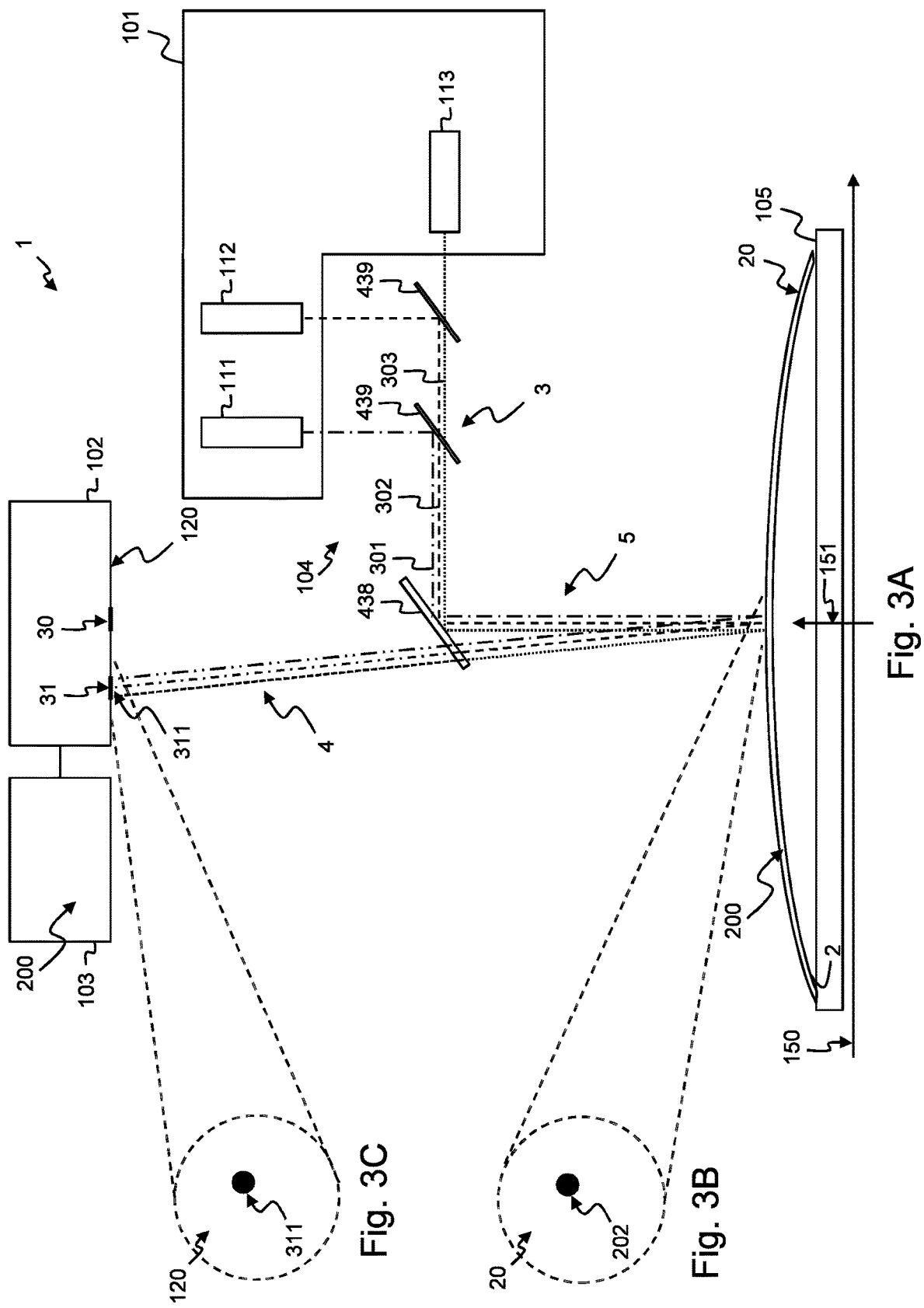

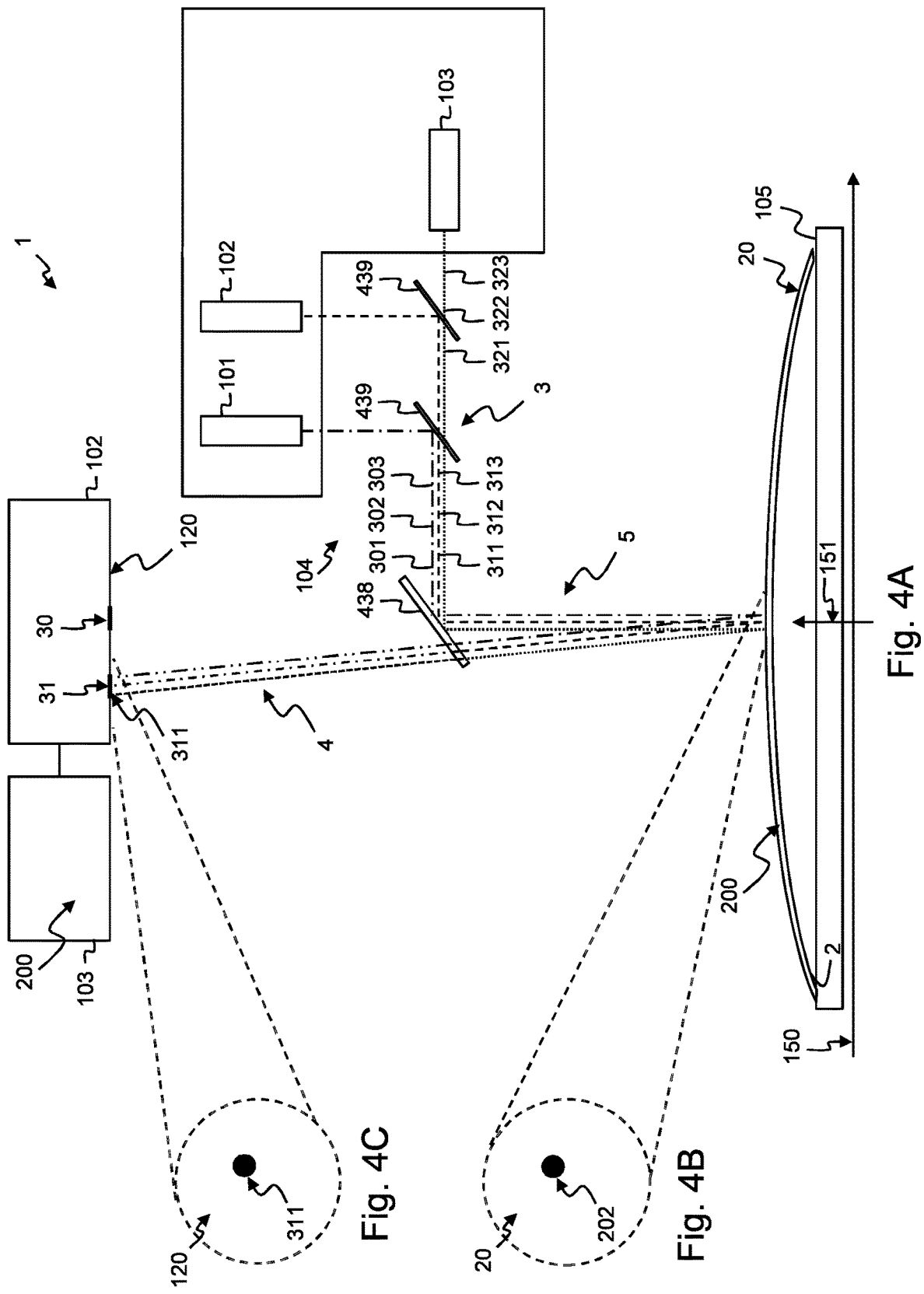

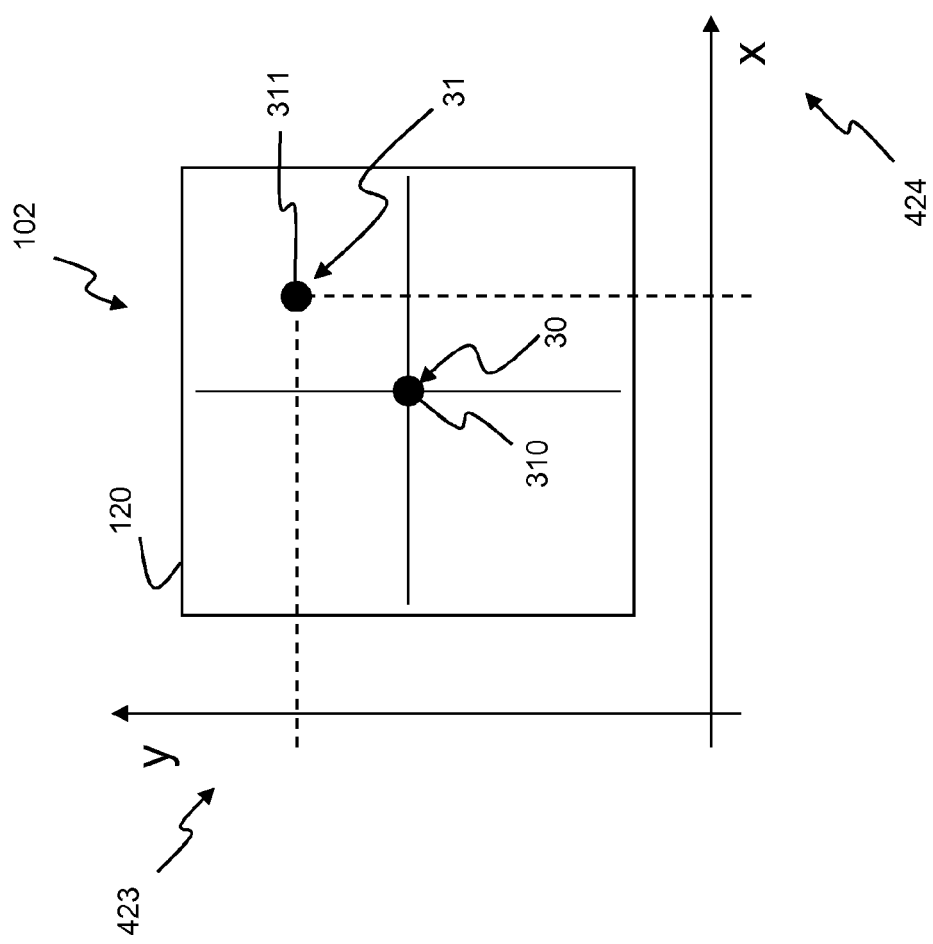

WAFER SURFACE CURVATURE DETERMINING SYSTEM

FIELD OF THE INVENTION

The present invention generally relates to an in-situ determination of the curvature of surfaces of one or more wafers. More particularly, the present invention relates to the in-situ determination of curvatures of surfaces of one or more epitaxial wafers in a multi-wafer epitaxial reactor.

BACKGROUND OF THE INVENTION

In the context of the epitaxial growth of semiconductor epitaxial stacks and thin-films on wafers, several parameters, such as for example, the temperature and the pressure in a reaction chamber, the thickness of the growing layers, the doping concentrations of the growing layers, the smoothness of the wafer surface, etc., are measured or determined in-situ and/or in real time, thereby monitoring the epitaxial growth.

The bow of a wafer corresponds to a curvature, or a deformation of the wafer surface independent of any thickness variation present. It is very important to accurately measure a curvature of a surface of an epitaxial wafer, as the curvature correlates directly to the strain in the growing layers of the epitaxial wafer. Understanding and controlling stresses in thin-films during growth processes is critical for achieving the desired optical, electronic and mechanical properties. Indeed, unwanted changes in stress can be introduced at any stage of the fabrication process, and may lead to a reduction in device performance as well as delamination or cracking of deposited films. In particular during the growth of epitaxial thin-films on wafers in multi-wafer reactors, it is therefore necessary to monitor the curvature of all the wafers in-situ as exactly as possible and in the shortest possible time. This is essential for facilitating high-yield epitaxial processes for the manufacture of semiconductor devices.

Problems can arise when determining the curvatures of wafers loaded onto a rotating susceptor during epitaxial growth. These wafers can indeed be non-uniformly bent, and the curvatures of their surfaces may vary with the rotation angle of the susceptor. Additionally, if the epitaxial process is not adequately controlled, defects may be generated, and relaxation processes may occur in the semiconductor wafers during fabrication, which according to their symmetry may further modify the rotational asymmetry of the wafers. It is therefore challenging to determine the curvatures of wafers loaded onto a rotating susceptor.

The US patent application US2013/0021610A1 published on Jan. 24, 2013 describes a system for measuring a curvature of surfaces of wafers in a multi-wafer epitaxial reactor. The wafers are loaded onto a susceptor which rotates in the reactor. The system of US2013/0021610A1 comprises a semiconductor laser which generates a light beam split up into two parallel partial beams by a birefringent element. A first light beam and a second light beam are therefore generated and are reflected by a surface of a wafer when irradiating the surface. The system further comprises a detector for detecting a reflected first light beam and a reflected second light beam corresponding respectively to the first light beam reflected by the surface and to the second light beam reflected by the surface. For each wafer in the reactor and when the wafers are rotating in the reactor, at least two measurements of the position of the reflected first light beam and of the reflected second light beam on the detector are performed at subsequent sampling times which are synchronized with the main rotation of the susceptor. A curvature of a surface of a wafer is then determined by averaging the distances between the spots formed by the reflected first light beam on the detector by at least the two measurements at subsequent sampling times during the rotation of the susceptor and the distances between the spots formed by the reflected second light beam on the detector by at least the two measurements at subsequent sampling times during the rotation of the susceptor.

In the system described in US2013/0021610A1, the curvature of the surface of a wafer changes the spacing between the reflection of the first light beam on the detector and the reflection of the second light beam on the detector. A curvature of the surface is therefore determined from the distance of the two spots of the first light beam and of the second light beam on the detector over time. Additionally, a measurement on a flat wafer is performed in US2013/0021610A1 which serves as a calibration that delivers the virtual initial distance between the light beams at the subsequent sampling times during the rotation of the susceptor. The system and the method described in US2013/0021610A1 are therefore complex as they require the synchronization of the sampling times of the measurements on the detector with the main rotation of the wafers on the susceptor, so that at least two measurements are performed for each wafer.

In the system described in US2013/0021610A1, the light beams are reflected from the surface of an epitaxial stack of the wafers. In the presence of destructive interferences for these light beams, no reflected light beam would form spots on the detector, and it would therefore be impossible to determine curvatures of surfaces of wafers if the reflected light beams are missing. Additionally, the unpredictability of the appearance of these destructive interferences during the epitaxial growth and under the rotation of the susceptor lowers the reliability of the system of US2013/0021610A1. It is indeed likely that it will be impossible at a certain time during the epitaxial growth and/or for a certain rotation of the susceptor to monitor the curvatures the surfaces of the wafers, thereby jeopardizing crucial information on the strain in the growing layers of the epitaxial wafer and on the composition of these growing layers.

It is an objective of the present invention to disclose a device that overcomes the above identified shortcomings of existing solutions. More particularly, it is an objective to disclose a system for in-situ measurement of a curvature of a surface of a wafer which is simple, accurate and which is robust towards destructive interferences, thereby rendering the determination of the curvatures of the surfaces of the wafers reliable.

SUMMARY OF THE INVENTION

According to a first aspect of the present invention, the above defined objectives are realized by a system for in-situ measurement of a curvature of a surface of a wafer, the system comprising:
- a multiwavelength light source module, adapted to emit incident light comprising a plurality of wavelengths;
- an optical setup configured to combine the incident light into a single beam and further configured to guide the single beam towards a surface of a wafer such that the single beam hits the surface at a single measuring spot on the surface; and
- a curvature determining unit, configured to determine a curvature of the surface of the wafer from reflected light corresponding to the single beam being reflected on the surface at the single measuring spot.

The system according to the present invention is adapted to measure in-situ curvatures of surfaces of one or more wafers, wherein the wafers are loaded onto a susceptor rotating in a multi-wafer epitaxial reactor. The system according to the present invention comprises a multiwavelength light source module emitting incident light comprising a plurality of wavelengths. The incident light may comprise one or more incident light beams, wherein each of the incident light beams comprises a plurality of wavelengths, wherein at least two wavelengths of the plurality of wavelengths are separated from each other by at least 5 nm. In other words, the incident light according to the present invention comprises at least two different wavelengths, for example three, four, five, etc. different wavelengths. This way, in presence of destructive interferences for the incident light in a wafer, at least one of the wavelengths of the plurality of wavelengths is reflected by the surface of the wafer and is collected as a reflected spot on a deflection detector, thereby allowing the determination of a curvature of a surface of the wafers. In other words, by relying on an incident light comprising a plurality of wavelengths, there will always be at least one wavelength of the incident light which is reflected by the surface of the wafer and which forms a reflected spot on the deflection detector. In other words, the number of layer thicknesses grown or etched on the surface of the wafer which give destructive interferences is strongly reduced when the incident light comprises a plurality of wavelengths than when the incident light comprises a single wavelength, thereby increasing the possibility of determining a curvature of the surface of the wafer. The system of the present invention is therefore robust to destructive interferences in wafers.

A curvature of a surface of a wafer according to the present invention is understood as a bow of the surface of the wafer, in other words a deformation of the surface of the wafer. A curvature or a bow of a surface of a wafer is the deviation of the center point of the median surface of a free, un-clamped wafer from the median surface to a reference plane. A surface of a wafer for example comprises a concave surface, i.e. curving in or hollowed inward, in other words turning inside. A surface of a wafer for example comprises a convex surface, i.e. curving out or extending outward, in other words turning outside.

Preferably, the optical setup according to the present invention is in-situ. For example, the optical setup according to the present invention is in-situ the reaction chamber, for example a multi-wafer epitaxial reactor, in which the wafer is loaded. Alternatively, the optical setup is positioned outside the reaction chamber, for example a multi-wafer epitaxial reactor, in which the wafer is loaded. Preferably, the optical setup combines the incident light into a single beam. When the multiwavelength light source module for example comprises two or more lasers, the lasers are overlaid by the optical setup such that the distance between the light beams emitted by the lasers before reflection at the surface of the wafers is more preferably less than 1 mm. The optical setup for example comprises one or more pinholes in order to focus the one or more beams into a single beam. The optical setup for example comprises a birefringent element positioned between the multi-wavelength light source and a surface such that the incident light passes through the birefringent element, wherein the main axis of the birefringent element is oriented with respect to the incident light such that the incident light is combined into a single beam. Alternatively, the optical setup for example comprises a cold mirror which reflects only up to a certain wavelength. Every wavelength of the incident light above this certain wavelength will be transmitted towards a surface of a wafer positioned on a susceptor. The cold mirror can be positioned under a 45 degrees angle in the incident light between the multi-wavelength light source and a surface such that the cold mirror overlays the incident light such as for example the lasers into a single beam.

The optical setup for example comprises a semi-transparent mirror. Alternatively, the optical setup for example comprises a beam splitter cube. The optical setup guides the single beam onto the surface of the wafer and the optical setup transmits as much of the reflected light directly onto the deflection detector without disturbing the reflected light.

The single beam hits the surface of a wafer at a single measuring spot on the surface of the wafer. In other words, only one measuring spot is formed on the surface of the wafer when the single beam hits the surface of the wafer. With the system according to the present invention, there is no need for two measuring spots on the surface of the wafer to determine the curvature of the surface. When the multi-wavelength light source module comprises a white light source or a broadband source, the single measuring spot formed on the surface of the wafer preferably has a diameter of a few millimeters, preferably less than 5 mm. When the multiwavelength light source module comprises two or more lasers, the two or more lasers are overlaid by the optical setup such that the distance between the light beams emitted by the lasers in the single beam before reflection at the surface of the wafers is more preferably less than 1 mm. When the single beam generated by two or more lasers hits the surface of a wafer, a single measuring spot formed on the surface of the wafer preferably has a diameter of a few millimeters, preferably less than 5 mm.

According to an optional aspect of the invention, the surface of the wafer comprises a reflectivity which changes as a function of time.

The surface of the wafer according to the present invention comprises a reflectivity which changes as a function of time. Indeed, a layer is grown or deposited on top of the wafer, for example during CVD or epitaxial growth. Alternatively, a layer is etched from the wafer, for example during etching such as for example ICP or CVD etching. Let's consider a stack comprising two layers, where a first layer comprises a refractive index $n_2$, a second layer is grown or deposited on top the first layer and the second layer comprises a refractive index $n_1$, and a medium on top of the second layer comprises a refractive index no. For normal incident light shining on the second layer, the difference in optical path length between a first ray of the incident light that reflects at the interface between the medium such as air for example and the second layer, and a second ray of the incident light that reflects at the interface between the second and the first layer equals two times the thickness d of the second layer being grown or deposited on top of the first layer. To have destructive interferences of light with a wavelength λ that propagates in a layer with refractive index $n_1$, the difference in optical path needs to be equal to $$\frac{\lambda}{2.n_1}$$

for a 180° phase shift, and will occur again every consecutive afterwards. So destructive interferences occur for a thickness d of the second layer equal to:

$$d = \left(m + \frac{1}{2}\right) \cdot \frac{\lambda}{2 n_1},$$

wherein m is a positive integer.

According to an optional aspect of the invention, the system further comprises a deflection detector, adapted to collect reflected light corresponding to the single beam being reflected on a surface at a single measuring spot; and wherein said curvature determining unit is further configured to determine a position of a single reflected spot formed by the reflected light on the deflection detector when the single beam reflects at a single measuring spot on a surface of a wafer, and to therefrom determine the curvature of the surface of the wafer.

According to an optional aspect of the invention, the curvature determining unit is further configured to determine a zero position of a calibration spot formed by the single beam on the deflection detector when the single beam reflects on a flat calibration surface.

It is possible to determine the curvature of a surface of a wafer with the present invention only from a deflection of a single beam formed at a position of one single reflected spot on a deflection detector with respect to a zero position. The zero position is measured during the calibration of the system when a single beam reflects on a flat calibration surface and forms a calibration spot of the deflection detector. For example, a flat calibration surface corresponds to a surface of a calibration wafer positioned in-situ in the reactor. A calibration wafer for example is a wafer demonstrating a thickness comprised between 200 µm and 1 mm and a surface of this wafer is a flat calibration surface when for example the relief of this surface is comprised between two parallel planes distant from each other of less than 2% of the thickness of the wafer. For example, typical bow or curvature values of wafers range between 50 µm concave and 200 µm convex. The system according to the present invention is adapted to resolve bows or curvatures of 10 µm. A calibration wafer should for example be flat within at least +/−5 µm.

In the sense of the present invention, the zero position of the calibration spot and the position of the single reflected spot are understood as the positions of the centers of the spots, where the single beam hits the deflection detector, respectively when being reflected by a flat calibration surface and when being reflected by a surface of a wafer. Preferably, the flat calibration surface is a surface of a calibration wafer. A calibration wafer is for example a 2 inches wafer, or a 4 inches wafer, or a 6 inches wafer, or a 8 inches wafer, or a 12 inches wafer. Similarly, the surface of a wafer corresponds to a surface of a 2 inches wafer, or a 4 inches wafer, or a 6 inches wafer, or a 8 inches wafer, or a 12 inches wafer. Alternatively, each wafer has a circular shape with a diameter ranging between 50 and 200 mm. In the context of the present invention, the term "light" includes electromagnetic radiation of any frequency, not only visible light, hence the terms infrared laser, ultraviolet laser and so on. The light can be initially polarized, or partially polarized or unpolarized. The deflection detector determines the angular deflection imparted by a surface of wafer to a light beam irradiating the surface of the wafer, by detecting at least one portion of the reflected light beam at a position on the detection deflector whose relation to the path which would be followed by such reflected light beam reflected on a flat calibration surface, thereby characterizing an angular deflection of the reflected light beam.

The reflected light hits the detector at a single reflected spot on the detector. In other words, only one reflected spot is formed on the detector when the single beam hits the surface of the wafer. With the system according to the present invention, there is no need for two reflected spots on the detector to determine the curvature of the surface. When the multiwavelength light source module comprises a white light source or a broadband source, the single reflected spot formed on the detector preferably has a diameter of a few millimeters, preferably less than 5 mm. When the multiwavelength light source module comprises two or more lasers, the two or more lasers are overlaid by the optical setup such that the distance between the light beams emitted by the lasers in the single beam before reflection at the surface of the wafers is more preferably less than 1 mm. When the single beam generated by two or more lasers hits the surface of a wafer, a single reflected spot formed on the detector preferably has a diameter of a few millimeters, preferably less than 5 mm.

According to an optional aspect of the invention, the multiwavelength light source module comprises one or more of the following:
  two or more laser sources, wherein at least two of said wavelengths are separated from each other by at least 5 nm;
  a white light source;
  a broadband light source.

The multiwavelength light source module comprises two or more laser sources, and each of lasers emits at a wavelength different from all the other wavelengths of the other lasers. A laser source in the context of the present invention is understood as a device which emits light through a process of optical amplification based on the stimulated emission of electromagnetic radiation. For example, a laser source is a red laser. Alternatively, a laser source is an infrared laser source. The plurality of wavelengths for example comprises two or more laser sources such that the wavelengths of two different lasers are distant from each other on a wavelength spectrum by at least 5 nm, or preferably by at least 10 nm, or preferably by at least 20 nm, more preferably by at least 50 nm and even more preferably by at least 100 nm. For example, electrically pumped semiconductor lasers diodes emit at wavelengths comprised between 375 nm and 3500 nm. For example, the output power of the lasers is a few milliwatts or a few watts. The choice of laser sources allows a specific selection of the wavelengths irradiating the surfaces of the wafers such that the absorption of one or more of the wavelengths of the incident light by the epitaxial layers grown in the reactor is minimized. The choice of coherent light sources ensures the detection of a light concentrated reflected spot on the deflection detector. This way, in presence of destructive interferences for the incident light in a wafer, at least one of the wavelengths of the plurality of wavelengths is reflected by the surface of the wafer and forms a reflected spot on the deflection detector, thereby allowing the determination of a curvature of a surface of the wafers.

Alternatively, the multiwavelength light source module comprises a white light source. A white light source is a light source with a broad optical bandwidth, for example 100 nm or more, and emits white light for example comprising wavelengths comprised between 400 nm and 780 nm. A white light source for example comprises an incandescent lamp, e.g. a tungsten-halogen lamp, emitting light with a smooth and very broad optical spectrum, with low spatial coherence.

Alternatively, the multiwavelength light source module comprises a broadband light source, which does not necessarily emit in the visible spectral region. Such source can be a superluminescent source, e.g. a superluminescent diode also referred to as SLED, and typically exhibits a high spatial coherence, making it easy to tightly focus the output or to deliver it for example through an optical fiber, even a single-mode fiber. Alternatively, the multiwavelength light source module comprises photonic crystal fibers.

According to an optional aspect of the invention, at least two of the plurality of wavelengths are separated from each other by at least 5 nm.

This way, in presence of destructive interferences for the incident light in a wafer, at least one of the wavelengths of the plurality of wavelengths is reflected by the surface of the wafer and is collected as a single reflected spot on a deflection detector, thereby allowing the determination of a curvature of a surface of the wafers. In other words, by relying on an incident light in the form of a single beam comprising a plurality of wavelengths, the number of layer thicknesses grown or etched on the surface of the wafer which give destructive interferences is strongly reduced. The system of the present invention is therefore robust to destructive interferences in wafers.

According to an optional aspect of the invention, the deflection detector comprises a position detector and the position detector is positioned in the system such that the zero position is on the position detector when the single beam reflects on a flat calibration surface.

A position detector in the context of the present invention is a position sensitive device and/or a position sensitive detector, also referred to as PSD. A position detector is a position photodetector or an optical position sensor, also referred to as OPS, which can measure a position of a light spot in one or two-dimensions on a sensor surface. The position detector is for example an isotropic sensor, more particularly a four-quadrant photodetector. Alternatively, the position detector is a discrete sensor. The sensor surface of the position detector is a photosensitive surface and is a few tens of centimeters square or a few hundreds of centimeters square. In other words, there exists at least a factor 10 between the size of the spot formed by the reflected light on the position detector and the area of the sensor surface. The positioning of the position detector in the system according to the present invention is such that a zero position is formed by a calibration spot on the position detector when the single beam reflects on a flat calibration surface. This zero position is then used as the origin of a (x;y) Cartesian coordinates system to determine the coordinates of a reflection spot and to allow the determination of a position of the single reflection spot formed on the position detector when the single beam reflects on a surface of a wafer, wherein the direction y is parallel to a radius of the susceptor and wherein the direction x is the tangent of a constant radius line on the susceptor, perpendicular to the direction y. Preferably, the position detector is positioned such that the zero position is centered on the position detector, i.e. such that the zero position is in the center of the sensor surface of the position detector. The position detector is positioned in the system such that the position is on the position detector when the single beam reflects on the surface of the wafer.

A four-quadrant photodetector is a silicon photodetector comprising four active photodiode areas. A four-quadrant photodetector can measure extremely small changes in the position of a light beam and is used for centering, nulling and detecting and measuring position displacements of a light beam. The positioning of the four-quadrant photodetector in the system according to the present invention is such that a zero position is formed by a calibration spot on the four-quadrant photodetector when the single beam reflects on a flat calibration surface. This zero position is then used as the origin of a (x;y) Cartesian coordinates system for the determination of a position of a reflection spot formed on the four-quadrant photodetector when the single beam reflects on a surface of a wafer, wherein the direction y is parallel to a radius of the susceptor and wherein the direction x is the tangent of a constant radius line on the susceptor, perpendicular to the direction y. Preferably, the four-quadrant photodetector is positioned such that the zero position is centered on the four-quadrant photodetector, i.e. such that the zero position is in the center of the sensor surface formed by the four quadrants of the position detector, i.e. such that the zero position is the origin of the (x;y) Cartesian coordinates.

According to an optional aspect of the invention, the position detector comprises a light intensity sensor.

A light intensity sensor is for example a photodetector or a photoresistor. The light intensity sensor is positioned in the system such that the zero position is on the light a sensor when the single beam reflects on a flat calibration surface.

For a single wafer configuration, for which the wafer is placed concentrically on the susceptor, a y signal is generated by the deflection detector and the y signal is proportional to the y position of a spot formed on the deflection detector by reflected light corresponding to single beam being reflected on a surface of a wafer. The y signal is proportional to the deflection in the direction y of the deflection detector. The deflection in the direction y of the deflection detector is the radial deflection relative to the wafer radius. The radial deflection is measured as a function of the rotation angle of the susceptor and then plotted as a function of the rotation angle of the susceptor. The plot of the radial deflection is fitted with a sine by the curvature determining unit in order to compensate for a possible wobble of the susceptor during its rotation. The offset of the sine fitting is proportional to the radial deflection and therewith to the curvature of the surface of the wafer. Preferably, a sine fitting is chosen. Alternatively, another fitting could be chosen, for example a polynomial fitting.

According to an optional aspect of the invention, the system further comprises a susceptor and a wafer loaded onto the susceptor; and the susceptor rotates in a plane perpendicular to the single beam such that a susceptor rotation axis of the susceptor is parallel to the single beam.

This way, the single beam irradiates a flat calibration surface of a calibration wafer perpendicularly. The susceptor rotates in a plane perpendicular to the single beam such that a susceptor rotation axis of the susceptor is parallel to the single beam when the single beam shines on a flat calibration surface. This allows an easier and more accurate calibration of the deflection detector.

One more wafers sit on a susceptor which is at a controlled temperature. The susceptor is made from a material resistant to the metalorganic compounds used, for example graphite is sometimes used. For growing nitrides and related materials, a special coating on the graphite susceptor is necessary to prevent corrosion by ammonia or $NH_3$ gas. One type of reactor used to carry out MOCVD is a cold-wall reactor. In a cold-wall reactor, the substrate is supported by a pedestal, which also acts as a susceptor. The pedestal/susceptor is the primary origin of heat energy in the reaction chamber. Only the susceptor is heated, so gases do not react before they reach the hot wafer surface. The pedestal/susceptor is made of a radiation-absorbing material such as carbon.

According to an optional aspect of the invention, the optical setup is further adapted to guide the single beam towards a surface of the wafer such that the single beam reflects on the surface of the wafer at a given radius from the susceptor rotation axis.

A wafer is placed centrally on a rotating susceptor. The single beam is transmitted through an optical viewport at a given point above the surface of the wafer at a given radius from the center of the wafer. The single beam then travels across a circular path across the surface of the wafer. This way, the system according to the present invention allows the determination of the spherical bow across each wafer loaded onto the susceptor.

According to an optional aspect of the invention, the curvature determining unit is further configured to determine the curvature of the surface of the wafer by fitting a deflection of the reflected light on the position detector as a function of a rotation angle of the susceptor.

Under the assumption that the surface of the susceptor is perpendicular to the single beam and that the wafer deforms in a first-order parabolic shape, the deflection occurs always in one direction which is along a line from the center towards the outside of the wafer. A y signal is generated by the deflection detector and the y signal is proportional to the y position of a spot formed on the deflection detector by reflected light corresponding to single beam being reflected on a surface of a wafer. The y signal is proportional to the deflection in the direction y of the deflection detector. The deflection in the direction y of the deflection detector is the radial deflection relative to the wafer radius. The radial deflection is measured as a function of the rotation angle of the susceptor and then plotted as a function of the rotation angle of the susceptor. The plot of the radial deflection is fitted with a sine by the curvature determining unit in order to compensate for the possible wobble of the susceptor. Indeed, the sine fitting compensates for the fact that the single beam is not perfectly perpendicular to the susceptor, and the sine fitting also compensates for the wobble associated with the rotary movement of the susceptor, the wobble being accentuated at the periphery of susceptor and the wobble of the susceptor resulting in poor epitaxial characteristics. The offset of the sine is proportional to the radial deflection and therewith to the curvature of the surface of the wafer over one full rotation of the susceptor. Preferably, a sine fitting is chosen. Alternatively, another fitting could be chosen, for example a polynomial fitting.

According to an optional aspect of the invention, the curvature determining unit is further configured to determine an offset of the fitting of the deflection of the reflected light as a function of the rotation angle of the susceptor, thereby determining the curvature of the surface of the wafer.

According to an optional aspect of the invention, the system further comprises a susceptor and a plurality of wafers loaded onto the susceptor; and wherein the susceptor rotates in a plane perpendicular to the single beam such that a susceptor rotation axis of the susceptor is parallel to the single beam.

According to an optional aspect of the invention, the optical setup is further adapted to guide the single beam towards surfaces of the plurality of the wafers such that the single beam reflects on the surfaces of the plurality of wafers at a given radius from the susceptor rotation axis.

The wafers are placed on a rotating susceptor. The single beam is transmitted through an optical viewport at a given point above the susceptor at a given radius from the center of the susceptor. The single beam then travels across a curved path across the surfaces of the wafers. The single beam now travels across a first wafer, then across a part of the susceptor, then across a second wafer, then across another part of the susceptor, then across a third wafer, etc. This way, the system according to the present invention allows the determination of the spherical bow across each wafer loaded onto the susceptor.

According to an optional aspect of the invention, the curvature determining unit is further configured to determine the curvature of each of the surfaces of the plurality of wafers by deriving a deflection of the reflected light on the position detector as a function of a rotation angle of the susceptor.

In case of a multi wafer configuration and under the assumption that the surface of the susceptor is perpendicular to the single beam and that the wafers deform in a first-order parabolic shape, the deflection occurs in x- and y direction, the direction y being parallel to a direction of the susceptor radius, and the direction x being perpendicular to the direction y. A x signal of the deflection of the reflected light along the direction x on the position detector is generated by the deflection detector as a function of rotation angle. The curvature determining unit then determines the derivative of the x signal as a function of the rotation angle of the susceptor and thereby determines the tangential deflection as a function of a rotation angle of the susceptor for each of the wafers encountered on the susceptor. The slope of the x signal on the angular range where a wafer is encountered on the susceptor by the incident light is then used to calculate the curvature of the surface of this particular wafer. Alternatively, the derivative is calculated as a function of the rotation angle of the susceptor and averaged over time, thereby determining an average curvature of a surface for all the wafers on the susceptor.

According to an optional aspect of the invention, the curvature determining unit is further configured to determine a slope of a deflection of the reflected light on the position detector as a function of a rotation angle of the susceptor for each of the surfaces of the plurality of wafers, and to average the slopes over time, thereby determining the curvature of each of the surfaces of the plurality of wafers.

According to an optional aspect of the invention, the system further comprises a plurality of multiwavelength light source modules wherein each of the multiwavelength light source modules is adapted to emit one or more incident light beams, wherein each of the one or more incident light beams comprises a plurality of wavelengths.

According to an optional aspect of the invention, the system further comprises a plurality of multiwavelength light source modules wherein each of the multiwavelength light source modules is adapted to emit one or more incident light beams, wherein each of the one or more incident light beams comprises a plurality of wavelengths; and wherein the optical setup is further configured to combine the one or more incident light beams into a single beam such that the single beam hits a surface of a wafer at a single measuring spot on the surface.

According to a second aspect of the invention, there is provided a method for in-situ measurement of a curvature of a surface of a wafer, the method comprising the steps of:

providing a multiwavelength light source module;

allowing the multiwavelength light source module to emit incident light comprising a plurality of wavelengths;
combining the incident light into a single beam;
guiding the single beam towards a surface of the wafer such that the single beam hits the surface at a single measuring spot on the surface; and
determining a curvature of the surface of the wafer from reflected light corresponding to the single beam being reflected on the surface at the single measuring spot.

The method according to the present invention allows the in-situ determination of curvatures of surfaces of one or more wafers, wherein the wafers are loaded onto a susceptor rotating in a multi-wafer epitaxial reactor. The method according to the present invention comprises providing a multiwavelength light source module emitting incident light comprising a plurality of wavelengths. The incident light may comprise one or more incident light beams, wherein each of the incident light beams comprises a plurality of wavelengths, wherein at least two wavelengths of the plurality of wavelengths are separated from each other by at least 5 nm. In other words, the incident light according to the present invention comprises at least two different wavelengths, for example three, four, five, etc. different wavelengths. This way, in presence of destructive interferences for the incident light in a wafer, at least one of the wavelengths of the plurality of wavelengths is reflected by the surface of the wafer and is collected as a reflected spot on a deflection detector, thereby allowing the determination of a curvature of a surface of the wafers. In other words, the number of layer thicknesses grown or etched on the surface of the wafer which give destructive interferences is strongly reduced when the incident light comprises a plurality of wavelengths than when the incident light comprises a single wavelength, thereby increasing the possibility of determining a curvature of the surface of the wafer. The method of the present invention is therefore robust to destructive interferences in wafers.

The incident light is combined into a single beam. When the multiwavelength light source module for example comprises two or more lasers, the lasers are overlaid such that the distance between the light beams emitted by the lasers before reflection at the surface of the wafers is more preferably less than 1 mm. For example a birefringent element is positioned between the multi-wavelength light source and a surface such that the incident light passes through the birefringent element, wherein the main axis of the birefringent element is oriented with respect to the incident light such that the incident light is combined into a single beam. Alternatively, a cold mirror is provided which reflects only up to a certain wavelength. Every wavelength of the incident light above this certain wavelength will be transmitted towards a surface of a wafer positioned on a susceptor. The cold mirror can be positioned under a 45 degrees angle in the incident light between the multi-wavelength light source and a surface such that the cold mirror overlays the incident light such as for example the lasers into a single beam.

The single beam hits the surface of a wafer at a single measuring spot on the surface of the wafer. In other words, only one measuring spot is formed on the surface of the wafer when the single beam hits the surface of the wafer. With the method according to the present invention, there is no need for two measuring spots on the surface of the wafer to determine the curvature of the surface. When the multiwavelength light source module comprises a white light source or a broadband source, the single measuring spot formed on the surface of the wafer preferably has a diameter of less than 5 mm, more preferably less than 1 mm. When the multiwavelength light source module comprises two or more lasers, the two or more lasers are overlaid by the optical setup such that the distance between the light beams emitted by the lasers in the single beam before reflection at the surface of the wafers is more preferably less than 1 mm. When the single beam generated by two or more lasers hits the surface of a wafer, a single measuring spot formed on the surface of the wafer preferably has a diameter of less than 5 mm, more preferably less than 1 mm.

According to an optional aspect of the invention, the method further comprises the steps of:
providing a deflection detector;
collecting with the deflection detector reflected light corresponding to the single beam being reflected on a surface;
determine a zero position of a calibration spot formed by the reflected light on the deflection detector when the single beam reflects on a flat calibration surface; and
with respect to the zero position, determining a position of a reflected spot formed by the reflected light on the deflection detector when the single beam reflects on a surface of a wafer, thereby determining the curvature of the surface of the wafer.

It is possible to determine the curvature of a surface of a wafer with the present invention only from a position of one reflected spot on a deflection detector with respect to a zero position. The zero position is measured during the calibration of the system when incident light reflects on a flat calibration surface and forms a calibration spot of the deflection detector. For example, a flat calibration surface corresponds to a surface of a calibration wafer positioned in-situ in the reactor. A calibration wafer for example is a wafer demonstrating a thickness comprised between 200 µm and 1 mm and a surface of this wafer is a flat calibration surface when for example the relief of this surface is comprised between two parallel planes distant from each other of less than 2% of the thickness of the wafer. For example, typical bow or curvature values of wafers range between 50 µm concave and 200 µm convex. The method according to the present invention is adapted to resolve bows or curvatures of 10 µm. A calibration wafer should for example be flat within at least +/−5 µm.

BRIEF DESCRIPTION OF THE DRAWINGS

FIG. 1A to 1C schematically illustrates an embodiment of a system according to the present invention during calibration of the system.

FIG. 2A to 2C schematically illustrates an embodiment of a system according to the present invention.

FIG. 3A to 3C schematically illustrates an embodiment of a system according to the present invention wherein a multiwavelength light source module comprises three laser sources.

FIG. 4A to 4C schematically illustrates an embodiment of a system according to the present invention wherein the system further comprises a plurality of multiwavelength light source modules each adapted to emit one or more incident light beams.

FIG. 5A schematically illustrates an embodiment of a position detector of a deflection detector.

DETAILED DESCRIPTION OF EMBODIMENT(S)

Figure 5B:
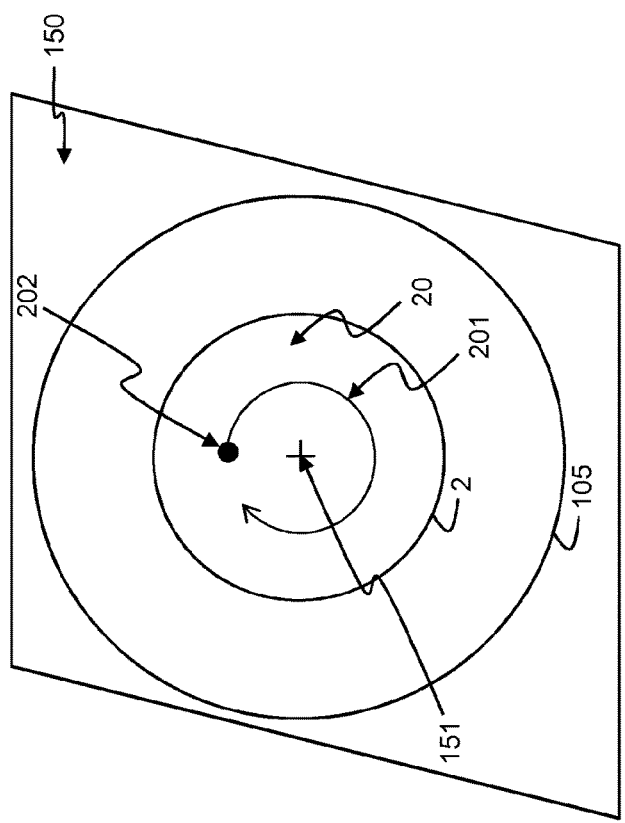
FIG. 5B schematically illustrates an embodiment of a single wafer configuration.

According to an embodiment shown in FIG. 1, a system 1 according to the present invention is being calibrated using a flat calibration surface 21 loaded onto a susceptor 105. The susceptor 105 may rotate in-situ in a plane perpendicularly to the single beam 5. The system 1 is suitable for in-situ measurement of a curvature of a surface of a wafer. For example, the system 1 is suitable for determining in-situ the curvature of a surface of a wafer loaded on a susceptor 105, for example during growth in a PECVD process, CVD process, MOCVD process, MBE process, etc. The system 1 is also suitable for determining in-situ the curvature of a surface of a wafer loaded on a susceptor 105 during an etching process, for example during an ICP process, a CVD process, etc. The system 1 comprises a multiwavelength light source module 101 which emits incident light 3 comprising three wavelengths 301;302;303. According to an alternative embodiment, the multiwavelength light source module 101 emits incident light 3 comprising more than two wavelengths 301;302;303, for example two, three, four, five, six wavelengths, etc. The multiwavelength light source module 101 comprises for example two or more laser sources, for example two, three, four, five laser sources, etc. The multiwavelength light source module 101 comprises for example a white light source. The multiwavelength light source module 101 comprises for example a broadband light source. At least two of the wavelengths 301;302;303 are distant from each other by at least 5 nm. The optical setup 104 of the system 1 combines the incident light 3 into a single beam 5. The optical setup 104 comprises for example a beam splitter cube 438 which guides the single beam 5 towards the flat calibration surface 21. According to an alternative embodiment, the optical setup 104 of the system 1 comprises for example a semi-transparent mirror 438 which guides the single beam 5 towards the flat calibration surface 21. According to an alternative embodiment, the optical setup 104 of the system 1 further comprises pinholes to combine the incident light 3 into a single beam 5. The system 1 further comprises a deflection detector 102 which collects reflected light 4 corresponding to the incident light 3 being reflected on a flat calibration surface 21 at a single measuring spot 202. The deflection detector 102 collects from the optical setup 104 a reflection of the single beam 5 on the flat calibration surface 21 at a single measuring spot 202, as visible on the zoom on FIG. 1B. The single measuring spot 202 has a diameter of a few millimetres on the calibration surface 21, preferably less than 5 millimetres on the calibration surface 21. The system 1 further comprises a curvature determining unit 103 which determines a curvature of a surface of a wafer from reflected light 4 corresponding to the single beam being reflected on the flat calibration surface 21 at a single measuring spot 202. The curvature determining unit 103 determines a zero position 30 of a single calibration spot 310 formed by the reflected light 4 on the deflection detector 102 when the single beam 5 reflects on the flat calibration surface 21 at a single measuring spot 202. The single calibration spot 310 on the deflection detector 102 has a diameter of a few millimetres, preferably less than 5 millimetres, as visible on the zoom on FIG. 1C. The deflection detector 102 indeed comprises a position detector 120 which is positioned in the system 1 such that the zero position 30 on the position detector 120 when the single beam 5 reflects on the flat calibration surface 21 at a single measuring spot 202. This way, the system 1 is calibrated by the determination of the curvature of the flat calibration surface 21, and the following determinations of curvatures of surfaces of wafers by the system 1 will be performed with respect to the curvature of the flat calibration surface 21. The curvature determining unit 103 is operationally coupled to the deflection detector 102. The deflection detector 102 comprises the curvature determining unit 103. According to an alternative embodiment, the curvature determining unit 103 is a remote unit of the system 1 according to the present invention and communicates with the deflection detector 102, remotely, for example via Ethernet, wirelessly or by being directly connected to the deflection detector 102.

According to an embodiment shown in FIG. 2A, a system 1 according to the present invention is used to determine a curvature 200 of a surface 20 of a wafer 2 being loaded onto a susceptor 105. The susceptor 105 rotates in-situ in a plane 150 perpendicularly to the single beam 5 such that the single beam 5 reflects on the surface 20 of the wafer 2 at a given radius from the susceptor rotation axis 151. For example, the system 1 is suitable for determining in-situ the curvature 200 of a surface 20 of a wafer 2 loaded on a susceptor 105, for example during growth in a PECVD process, CVD process, MOCVD process, MBE process, etc. The system 1 is also suitable for determining in-situ the curvature 200 of a surface 20 of a wafer 2 loaded on a susceptor 105 during an etching process, for example during an ICP process, a CVD process, etc. The system 1 comprises a multiwavelength light source module 101 which emits incident light 3 comprising three wavelengths 301;302;303. According to an alternative embodiment, the multiwavelength light source module 101 emits incident light 3 comprising more than two wavelengths 301;302;303, for example two, three, four, five, six wavelengths, etc. The multiwavelength light source module 101 comprises for example a white light source 114. The multiwavelength light source module 101 comprises for example a broadband light source 115. At least two of the wavelengths 301;302;303 are distant from each other by at least 5 nm. The optical setup 104 of the system 1 combines the incident light 3 into a single beam 5. The optical setup 104 comprises for example a beam splitter cube 438 which guides the single beam 5 towards the surface 20 of the wafer 2. According to an alternative embodiment, the optical setup 104 of the system 1 comprises for example a semi-transparent mirror 438 which guides the single beam 5 towards the surface 20 of the wafer 2. According to an alternative embodiment, the optical setup 104 of the system 1 further comprises pinholes to combine the incident light 3 into a single beam 5. The system 1 further comprises a deflection detector 102 which collects reflected light 4 corresponding to the single beam 5 being reflected on the surface 20 at a single measuring spot 202, as visible in the zoom of FIG. 2B. The single measuring spot 202 has a diameter of a few millimetres on the surface 20, preferably less than 5 millimetres on the surface 20. The deflection detector 102 collects from the optical setup 104 a reflection of the single beam 5 on the surface 20 at a single measuring spot 202. The system 1 further comprises a curvature determining unit 103 which determines a curvature 200 of the surface 20 of the wafer 2 from reflected light 4 corresponding to the single beam 5 being reflected on the surface 20 at a single measuring spot 202. During calibration as described in FIG. 1A, the curvature determining unit 103 determined a zero position 30 of a single calibration spot 310 formed by the reflected light 4 on the deflection detector 102 when the single beam 5 reflects on a flat calibration surface 21 at a single measuring spot 202. The curvature determining unit 103 determines a position 31 of a single reflected spot 311 formed by the reflected light 4 on the deflection detector 102 when the single beam 5 reflects on the surface 20 of the wafer 2 at a single measuring spot 202, as visible on the zoom of FIG. 2C. The single reflected spot 311 on the deflection detector 102 has a diameter of a few millimetres, preferably less than 5 millimetres. The curvature determining unit 103 then determines the curvature 200 of the surface 20 of the wafer 2 by fitting a deflection of the reflected light 4 on the deflection detector 102 and more particularly on the position detector 120 as a function of a rotation angle of said susceptor 105. The curvature determining unit 103 is operationally coupled to the deflection detector 102. The deflection detector 102 comprises the curvature determining unit 103. According to an alternative embodiment, the curvature determining unit 103 is a remote unit of the system 1 according to the present invention and communicates with the deflection detector 102, remotely, for example via Ethernet, wirelessly or by being directly connected to the deflection detector 102.

According to an embodiment shown in FIG. 3A, a system 1 according to the present invention is used to determine a curvature 200 of a surface 20 of a wafer 2 being loaded onto a susceptor 105. The susceptor 105 rotates in-situ in a plane 150 perpendicularly to the single beam 5 such that the single beam 5 reflects on the surface 20 of the wafer 2 at a given radius from the susceptor rotation axis 151. For example, the system 1 is suitable for determining in-situ the curvature 200 of a surface 20 of a wafer 2 loaded on a susceptor 105, for example during growth in a PECVD process, CVD process, MOCVD process, MBE process, etc. The system 1 is also suitable for determining in-situ the curvature 200 of a surface 20 of a wafer 2 loaded on a susceptor 105 during an etching process, for example during an ICP process, a CVD process, etc. The system 1 comprises a multiwavelength light source module 101 which emits incident light 3 comprising three wavelengths 301;302;303. According to an alternative embodiment, the multiwavelength light source module 101 emits incident light 3 comprising more than two wavelengths 301;302;303, for example two, three, four, five, six wavelengths, etc. The multiwavelength light source module 101 comprises for example two or more laser sources 111;112;113, for example two, three, four, five laser sources, etc. At least two of the wavelengths 301;302;303 are distant from each other by at least 5 nm. The system 1 further comprises an optical setup 104. The optical setup 104 combines the incident light 3 into a single beam 5. According to an alternative embodiment, the optical setup 104 of the system 1 further comprises pinholes to combine the incident light 3 into a single beam 5. The optical setup 104 comprises for example one or more birefringent elements 439 and/or one or more cold mirrors 439 which combines the incident light 3 coming from the three laser sources 111;112;113 into a single beam 5. The optical setup 104 further for example a beam splitter cube 438 which guides the single beam 5 towards the surface 20 of the wafer 2. According to an alternative embodiment, the optical setup 104 of the system 1 comprises for example a semi-transparent mirror 438 which guides the single beam 5 towards the surface 20 of the wafer 2. The system 1 further comprises a deflection detector 102 which collects reflected light 4 corresponding to the incident light 3 being reflected on the surface 20. The deflection detector 102 collects from the optical setup 104 a reflection of the single beam 5 on the surface 20. The system 1 further comprises a curvature determining unit 103 which determines a curvature 200 of the surface 20 of the wafer 2 from reflected light 4 corresponding to the single beam 5 being reflected on the surface 20 at a single measuring spot 202, as visible in the zoom of FIG. 3B. The single measuring spot 202 has a diameter of a few millimetres on the surface 20, preferably less than 5 millimetres on the surface 20. During calibration as described in FIG. 1A, the curvature determining unit 103 determined a zero position 30 of a single calibration spot 310 formed by the reflected light 4 on the deflection detector 102 when the single beam 5 reflects on a flat calibration surface 21 at a single measuring spot 202. The curvature determining unit 103 determines a position 31 of a single reflected spot 311 formed by the reflected light 4 on the deflection detector 102 when the single beam 5 reflects on the surface 20 of the wafer 2 at a single measuring spot 202, as visible on the zoom of FIG. 3C. The single reflected spot 311 on the deflection detector 102 has a diameter of a few millimetres, preferably less than 5 millimetres. The curvature determining unit 103 then determines the curvature 200 of the surface 20 of the wafer 2 by fitting a deflection of the reflected light 4 on the deflection detector 102 and more particularly on the position detector 120 as a function of a rotation angle of said susceptor 105. The curvature determining unit 103 is operationally coupled to the deflection detector 102. The deflection detector 102 comprises the curvature determining unit 103. According to an alternative embodiment, the curvature determining unit 103 is a remote unit of the system 1 according to the present invention and communicates with the deflection detector 102, remotely, for example via Ethernet, wirelessly or by being directly connected to the deflection detector 102.

According to an embodiment shown in FIG. 4A, a system 1 according to the present invention is used to determine a curvature 200 of a surface 20 of a wafer 2 being loaded onto a susceptor 105. The susceptor 105 rotates in-situ in a plane 150 perpendicularly to the single beam 5 such that the single beam 5 reflects on the surface 20 of the wafer 2 at a given radius from the susceptor rotation axis 151. For example, the system 1 is suitable for determining in-situ the curvature 200 of a surface 20 of a wafer 2 loaded on a susceptor 105, for example during growth in a PECVD process, CVD process, MOCVD process, MBE process, etc. The system 1 is also suitable for determining in-situ the curvature 200 of a surface 20 of a wafer 2 loaded on a susceptor 105 during an etching process, for example during an ICP process, a CVD process, etc. The system 1 comprises three multiwavelength light source modules 101;102;103, wherein each of the multiwavelength light source modules 101;102;103 emits one incident light beam 3, wherein each of the one or more incident light beams 3 comprises three wavelengths 301; 302;303;311;312;313;321;322;323. According to an alternative embodiment, the system 1 comprises a plurality of multiwavelength light source modules, for example two, three, four, five, etc. According to a further alternative embodiment, each of the multiwavelength light source modules 101;102;103 emits one or more incident light beams 3, for example one, two, three, four, five, etc. and wherein each of the one or more incident light beams 3 comprises a plurality of wavelengths, for example two, three, four, five, six wavelengths, etc. At least two of the wavelengths 301; 302;303;311;312;313;321;322;323 are distant from each other by at least 5 nm. The system 1 further comprises an optical setup 104. The optical setup comprises for example one or more birefringent elements 439 and/or one or more cold mirrors 439 which combines the incident light 3 coming from the three laser sources 111;112;113 into a single beam 5. The optical setup 104 further for example a beam splitter cube 438 which guides the single beam 5 towards the surface 20 of the wafer 2. According to an alternative embodiment, the optical setup 104 of the system 1 further comprises pinholes to combine the incident light 3 into a single beam 5. According to an alternative embodiment, the optical setup 104 of the system 1 comprises for example a semi-transparent mirror 438 which guides the single beam 5 towards the surface 20 of the wafer 2. The system 1 further comprises a deflection detector 102 which collects reflected light 4 corresponding to the single beam 5 being reflected on the surface 20 at a single measuring spot 202, as visible in the zoom of FIG. 4B. The single measuring spot 202 has a diameter of a few millimetres on the surface 20, preferably less than 5 millimetres on the surface 20. The deflection detector 102 collects from the optical setup 104 a reflection of the single beam 5 on the surface 20. The system 1 further comprises a curvature determining unit 103 which determines a curvature 200 of the surface 20 of the wafer 2 from reflected light 4 corresponding to the single beam 5 being reflected on the surface 20. During calibration as described in FIG. 1A, the curvature determining unit 103 determined a zero position 30 of a calibration spot 310 formed by the reflected light 4 on the deflection detector 102 when the single beam 5 reflects on a flat calibration surface 21. The curvature determining unit 103 determines a position 31 of a single reflected spot 311 formed by the reflected light 4 on the deflection detector 102 when the single beam 5 reflects on the surface 20 of the wafer 2 at a single measuring spot 202, as visible in the zoom of FIG. 4C. The single reflected spot 311 on the deflection detector 102 has a diameter of a few millimetres, preferably less than 5 millimetres. The curvature determining unit 103 then determines the curvature 200 of the surface 20 of the wafer 2 by fitting a deflection of the reflected light 4 on the deflection detector 102 and more particularly on the position detector 120 as a function of a rotation angle of said susceptor 105. The curvature determining unit 103 is operationally coupled to the deflection detector 102. The deflection detector 102 comprises the curvature determining unit 103. According to an alternative embodiment, the curvature determining unit 103 is a remote unit of the system 1 according to the present invention and communicates with the deflection detector 102, remotely, for example via Ethernet, wirelessly or by being directly connected to the deflection detector 102.

Figure 5C:
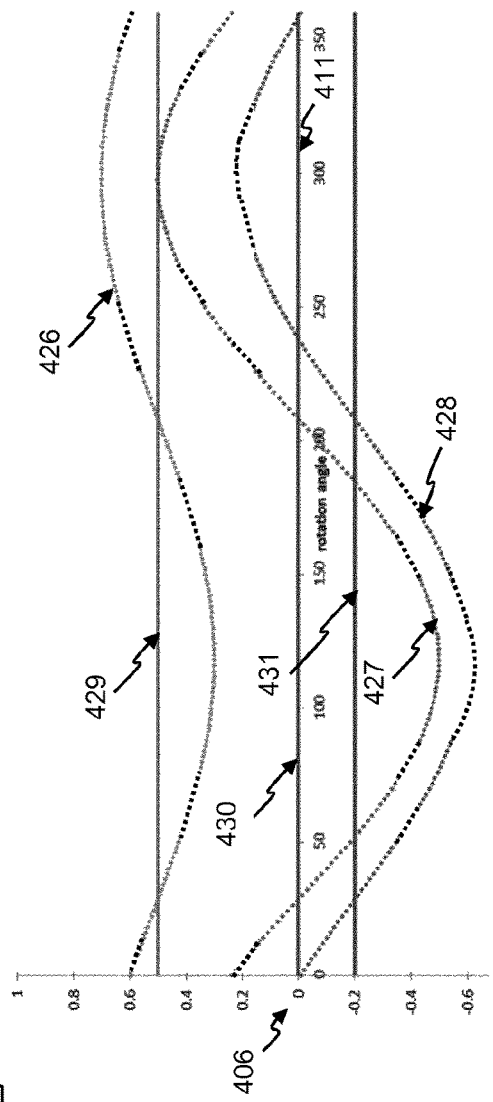
FIG. 5C schematically illustrates an embodiment of a normalized deflection of reflected light on the position detector as a function of a rotation angle of a susceptor in a single wafer configuration.
Figure 5D:
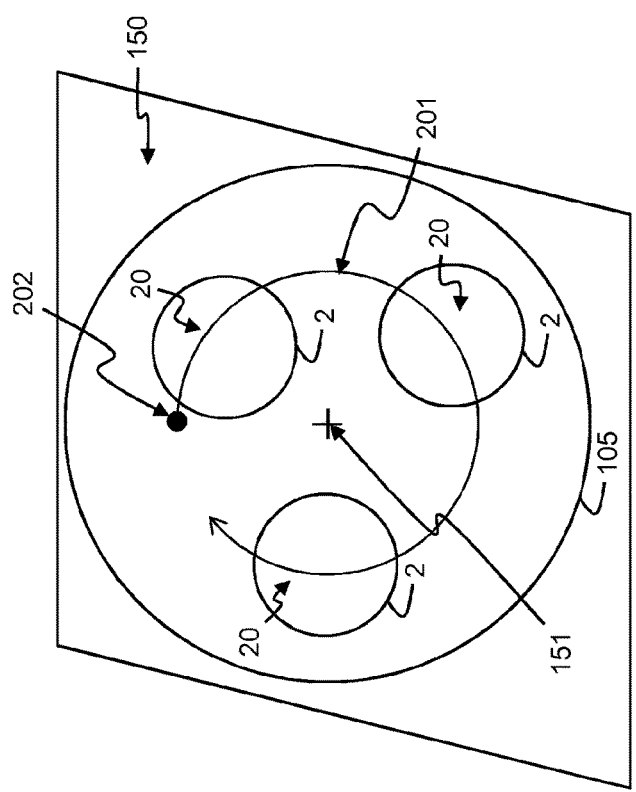
FIG. 5D schematically illustrates an embodiment of a multi wafer configuration.
Figure 5E:
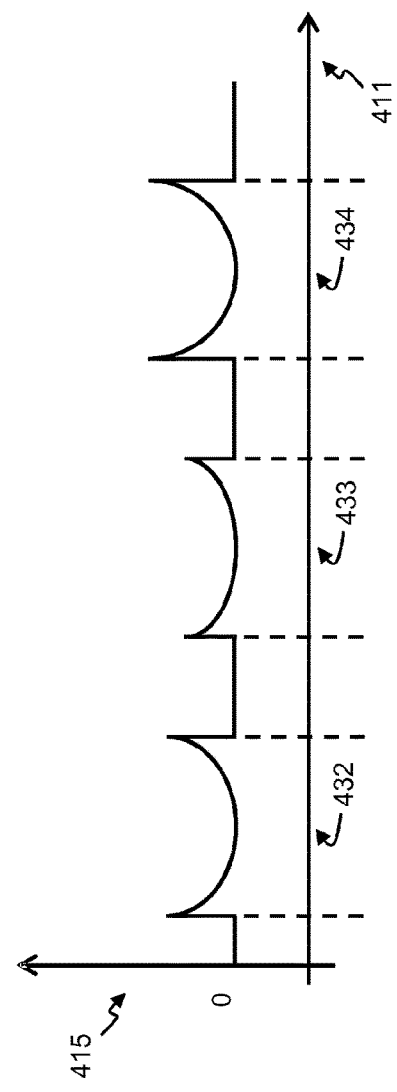
FIG. 5E schematically illustrates an embodiment of an intensity of reflected light as a function of a rotation angle of a susceptor in a multi wafer configuration.

According to an embodiment shown in FIG. 5A, a deflection detector 102 comprises a position detector 120. The position detector 120 of FIG. 5A is a four-quadrant photodetector. The positioning of the position detector 120 in the system 1 according to the present invention is such that a zero position 30 is formed by a single calibration spot 310 on the position detector 120 when the single beam 5 reflects on a flat calibration surface 21. This zero position 30 is then preferably used as the origin of a (x;y) Cartesian coordinates system 423;424 for the determination of a position 31 of a single reflection spot 311 formed on the position detector 120 when the incident light 3 reflects on a surface 20 of a wafer 2 at a single measuring spot 202, wherein the direction y is parallel to a radius of the susceptor and wherein the direction x is the tangent of a constant radius line on the susceptor, perpendicular to the direction y. Preferably, the position detector 120 is positioned such that the zero position 30 is centered on the position detector 120, i.e. such that the zero position 30 is in the center of the sensor surface formed by the four quadrants of the position detector 120, i.e. such that the zero position 30 is the origin of the (x;y) Cartesian coordinates 423;424. The single reflected spot 311 on the deflection detector 102 has a diameter of a few millimetres, preferably less than 5 millimetres. The single calibration spot 310 on the deflection detector 102 has a diameter of a few millimetres, preferably less than 5 millimetres. Preferably, the single reflected spot 311 is aligned on the deflection detector 102 such that, and it is large enough to overlap on the four quadrants of the position detector 120. In other words, the single reflected spot 311 is such that it demonstrates a maximized deviation and it covers the zero position 30 to overlap on all four quadrants. According to an embodiment shown in FIG. 5B, a single wafer configuration is schematically depicted for the determination of a curvature of a surface 20 of a wafer 2. A single wafer 2 is loaded onto a susceptor 105 which rotates in-situ in a plane 150 perpendicularly to the single beam 5 of the incident light such that the single beam 5 of the incident light reflects on the surface 20 of the wafer 2 at a given radius 201 from the susceptor rotation axis 151 and at a single measuring spot 202. FIG. 5C then depicts a deflection in direction y 406 of reflected light corresponding to incident light being reflected on the surface of the single wafer 2 of FIG. 5B, as a function of a rotation angle 411 of the susceptor 105 of FIG. 5B onto which the wafer 2 is loaded. When the single wafer 2 of FIG. 5B comprises a flat calibration surface, the deflection of reflected light is measured as a function of the rotation angle 411 of the susceptor 105, and the curvature determining unit 103 of FIG. 1A to 4A fits the deflection of the reflected light on the position detector 120 along the direction y with a sine function 427. In other words, the curvature determining unit 103 of FIG. 1A to 4A fits the deflection of the single reflected spot 311 along the direction y formed by the reflected light at the position 31 on the position detector 120 as a function of a rotation angle of the susceptor 105 with a sine function 427. The offset 430 of the sine function 427 is used as calibration for the curvature of surfaces of single wafers loaded onto the susceptor 105. The system according to the present invention, and more particularly the curvature determining unit 103 of FIG. 1A to 4A, is therefore calibrated such that the deflection in direction y of the reflected light on the position detector 120 oscillates around 0 as a function of the rotation angle 411 of the susceptor 105 because of the wobble of the susceptor 105 during rotation. The offset 430 of the sine function 427 therefore corresponds to 0 on the deflection in direction y 406 of reflected light. When the single wafer 2 of FIG. 5B comprises a surface 20 which is not a flat calibration surface, the deflection of reflected light is measured as a function of the rotation angle 411 of the susceptor 105, and the curvature determining unit 103 of FIG. 1A to 4A fits the deflection of the reflected light on the position detector 120 with a sine function 426. In other words, the curvature determining unit 103 of FIG. 1A to 4A fits the deflection in direction y 406 of the single reflected spot 311 formed by the reflected light at the position 31 on the position detector 120 as a function of a rotation angle of the susceptor 105 with a sine function 426. The sine function 426 oscillates around a positive offset 429 and the offset 429 of the sine function 426 is used to determine the curvature of the single wafer 2 loaded onto the susceptor 105. In other words, the offset 429 of the sine function 426 is a measure for the wafer bow of the wafer 2. The offset 429 of the sine function 426 is larger than the offset 430 of the sine function 427. In other words, the offset 429 of the sine function 426 is positive. The surface 20 of the wafer 2 of FIG. 5C is convex. When the single wafer 2 of FIG. 5B comprises a surface 20 which is not a flat calibration surface, the deflection of reflected light on the position detector 120 along the direction y is measured as a function of the rotation angle 411 of the susceptor 105, and the curvature determining unit 103 of FIG. 1A to 4A fits the deflection of the reflected light on the position detector 120 along the direction y 406 with a sine function 428. In other words, the curvature determining unit 103 of FIG. 1A to 4A fits the deflection of the single reflected spot 311 along the direction y formed by the reflected light at the position 31 on the position detector 120 as a function of a rotation angle of the susceptor 105 with a sine function 428. The sine function 428 oscillates around a negative offset 431 and the offset 431 of the sine function 428 is used to determine the curvature of the single wafer 2 loaded onto the susceptor 105. In other words, the offset 431 of the sine function 428 is a measure for the wafer bow of the wafer 2. The offset 431 of the sine function 428 is larger than the offset 430 of the sine function 427. In other words, the offset 431 of the sine function 428 is positive. The surface 20 of the wafer 2 of FIG. 5C is concave. According to an embodiment shown in FIG. 5D, a multi wafer configuration is schematically depicted for the determination of a curvature of three surfaces of three wafers 432;433;434. Three wafers 432;433;434 are loaded onto a susceptor 105 which rotates in-situ in a plane 150 perpendicularly to the single beam 5 of the incident light such that the single beam 5 of the incident light reflects on the surfaces of the wafers 432;433;434 at a given radius from the susceptor rotation axis 151. According to an alternative embodiment, two, four, five, six, seven, eight or more than eight wafers could be loaded onto the susceptor 105. The curvature determining unit 103 of FIG. 1A to 4A determines the curvature of each of the surfaces of the three wafers 432;433;434 by deriving the deflection along the direction x of the reflected light on the deflection detector 102 as a function of rotation angle of the susceptor 105 when the incident light reflects on the surface of one of the wafers 432;433;434. In other words, the curvature determining unit 103 of FIG. 1A to 4A derives the deflection in direction x of the single reflected spot 311 formed by the reflected light at the position 31 on the position detector 120 when incident light encounters a surface of a wafer loaded onto the susceptor 105 and reflects on the surface of the wafer as a function of a rotation angle of the susceptor 105. FIG. 5E schematically illustrates the intensity 415 of reflected light as a function of a rotation angle 411 of a susceptor in a multi wafer configuration, and more particularly for the three wafers 432;433;434. FIG. 5E demonstrates that a gradient in thickness of the layers exists for the three wafers 432;433; 434.

Figure 6:
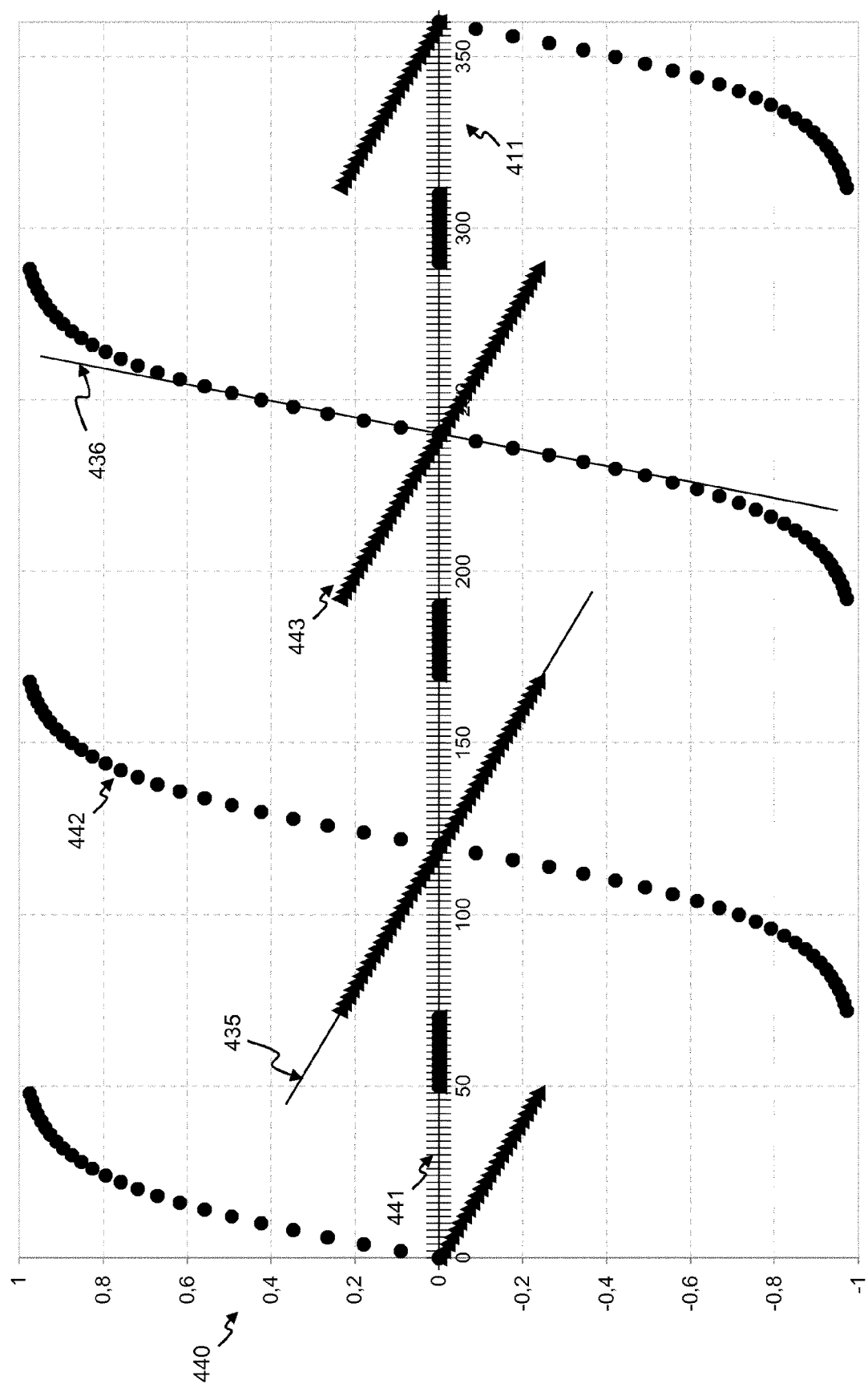
FIG. 6 schematically illustrates the normalized deflection of reflected light on the position detector as a function of rotation angle of a susceptor for a multi-wafer configuration.

FIG. 6 schematically illustrates a normalized deflection 440 of reflected light 4 on the position detector 120 of the system 1 of FIG. 1A to 4A along a direction x being perpendicular to a direction y, wherein the direction y is being parallel to a susceptor radius direction, as a function of a rotation angle 411 of a susceptor 105 on which three wafers 432;433;434 are loaded. The slopes of the normalized deflection 440 at the wafer centre angle portions comprise information indicative for a curvature of a surface of the corresponding wafer. The normalized deflection 441 of reflected light reflecting on a surface of a wafer as a function of a rotation angle 411 of the susceptor onto which the wafer is loaded is equal to 0 and is therefore indicative for a flat curvature of the surface of the wafer. A slope 435 of a normalized deflection 442 of reflected light reflecting on a surface of a wafer as a function of a rotation angle 411 of the susceptor onto which the wafer is loaded is positive and is therefore indicative for a convex curvature of the surface of the wafer. A slope 436 of a normalized deflection 443 of reflected light reflecting on a surface of a wafer as a function of a rotation angle 411 of the susceptor onto which the wafer is loaded is negative and is therefore indicative for a concave curvature of the surface of the wafer.

Figure 7:
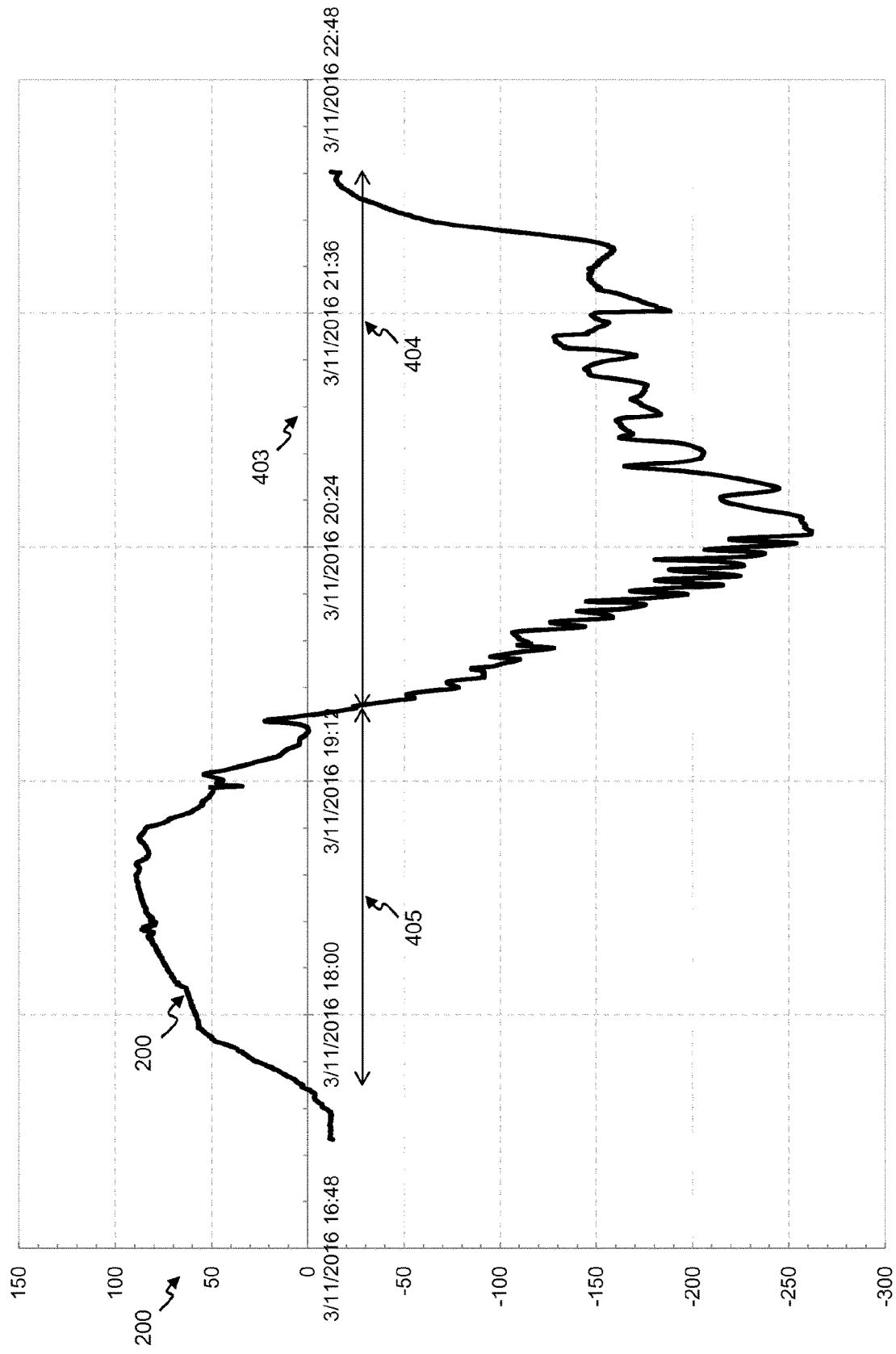
FIG. 7 schematically illustrates a determination of a curvature of a surface of a wafer as a function of time.

FIG. 7 illustrates an example of a curvature 200 of a surface of a wafer by the system 1 according to the present invention as a function of time 403, for a single wafer configuration. The curvature 200 of a surface of a wafer is determined by the curvature determining unit of the system 1. When the curvature 200 of the surface of a wafer is positive, i.e. in the range indicated by the arrow 405, the surface of the wafer is by definition convex. When the curvature 200 of the surface of a wafer is negative, i.e. in the range indicated by the arrow 404, the surface of the wafer is by definition concave.

Figure 8:
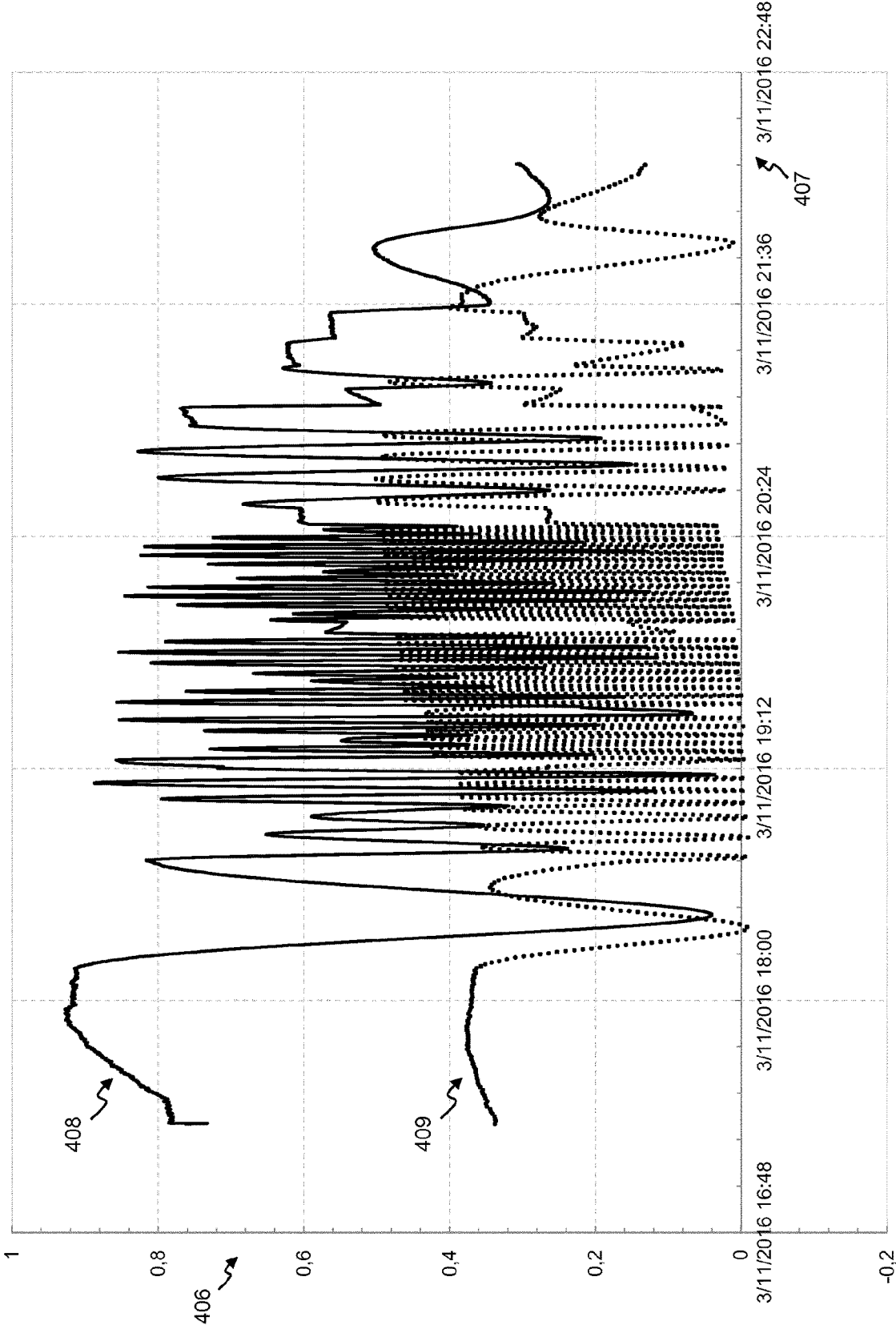
FIG. 8 schematically illustrates a measured intensity of reflected light corresponding to incident light comprising a single wavelength and a measured intensity of the reflected light corresponding to incident light comprising two wavelengths, both as a function of time.

FIG. 8 illustrates an example of an intensity 406 of a reflected light as a function of time 407 in the case of a single wafer configuration. The incident light is emitted by a single laser emitting at 658 nm in the case of the intensity 409, and the incident light is emitted by a dual laser comprising two wavelengths different from each other in the case of the intensity 408. As it can be seen on the curve of the intensity 409, the system 1 according to the present invention allows to determine that the intensity 409 is close to zero at several occasions in time, thereby rendering the determination of a curvature of a surface of a wafer for these layer thicknesses impossible due to the existence of destructive interferences for this wavelength and for these layer thicknesses. On the contrary, as it can be seen on the curve of the intensity 408, the system 1 according to the present invention allows to determine that the intensity 408 is rarely close to zero in time, thereby increasing the possibility of determining a curvature of a surface of a wafer.

Figure 9:
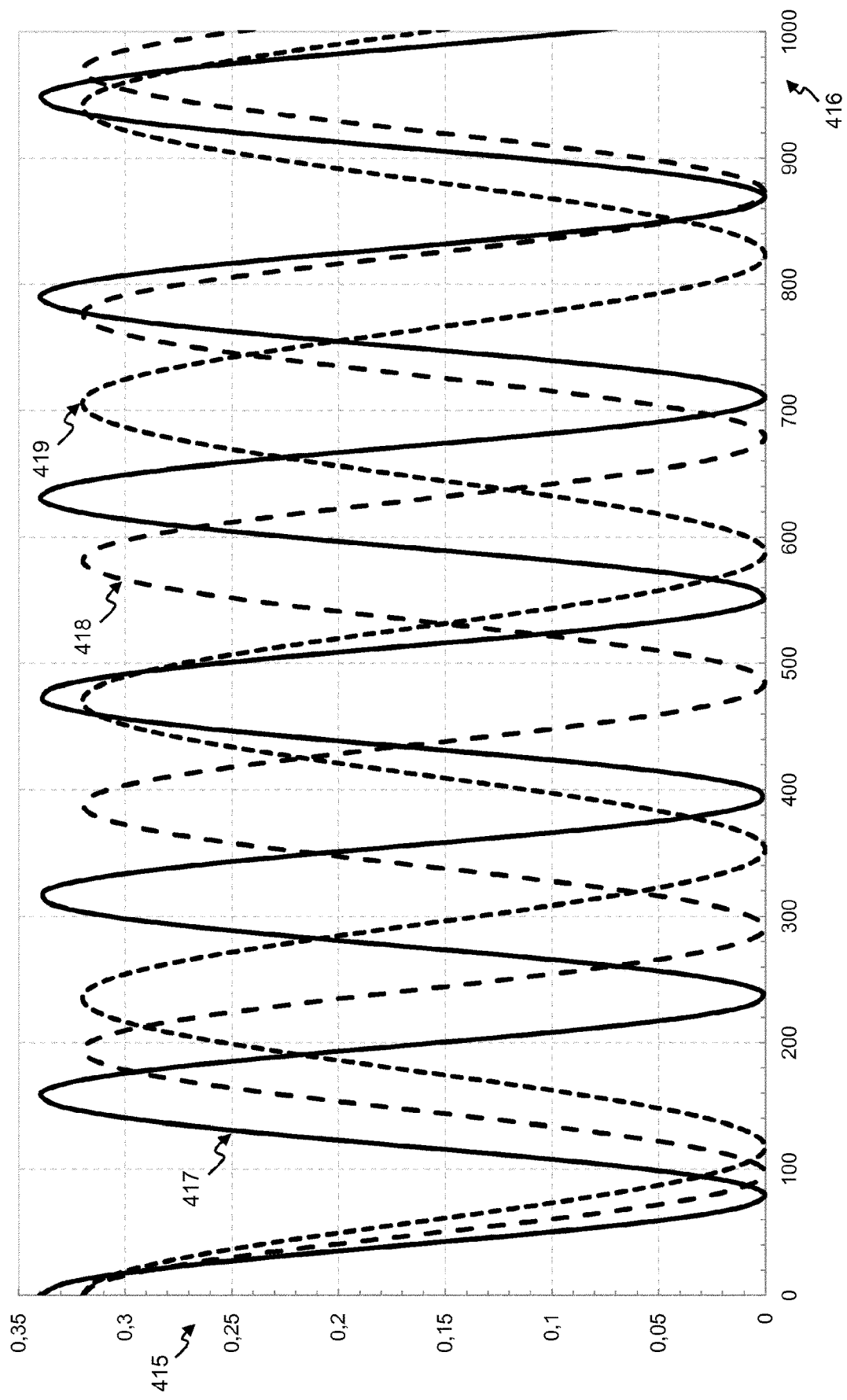
FIG. 9 schematically illustrates a measured intensity of reflected light corresponding to incident light comprising single wavelengths as a function of a thickness of a layer being grown on a surface of a wafer.

FIG. 9 illustrates an example of a reflected intensity 415 of reflected light as a function of a thickness 416 of a layer being grown on top of a surface of a wafer loaded onto a susceptor, for the in-situ determination of a curvature of the surface of the wafer using the system 1 according to the present invention. The plot 417 corresponds to the reflected intensity of reflected light corresponding to incident light as a single beam being reflected on the surface of the wafer, wherein the incident light comprises a single wavelength at 658 nm emitted by a laser source. The plot 418 corresponds to the reflected intensity of reflected light corresponding to incident light as a single beam being reflected on the surface of the wafer, wherein the incident light comprises a single wavelength at 808 nm emitted by a laser source different from the laser source emitting at 658 nm. The plot 419 corresponds to the reflected intensity of reflected light corresponding to incident light as a single beam being reflected on the surface of the wafer, wherein the incident light comprises a single wavelength at 980 nm emitted by a laser source different from the laser source emitting at 658 nm and different from the laser source emitting at 808 nm. As can be seen in FIG. 9, there exist several thicknesses 416 of a layer being grown on top of a surface of a wafer for which the reflected intensity 415 of the plots 417, 418 and 419 is close to zero, thereby rendering the determination of a curvature of a surface of a wafer at these thicknesses impossible due to the existence of destructive interferences for these wavelengths and for these layer thicknesses. Additionally, the thicknesses 416 of a layer being grown on top of a surface of a wafer for which the reflected intensity 415 is close to zero are different for each plot 417, 418 or 419. With each plot 417, 418 or 419, there exist several thicknesses 416 for which it is not possible to determine a curvature of the wafer because of the existence of destructive interferences for these plots 417, 418 or 419.

Figure 10:
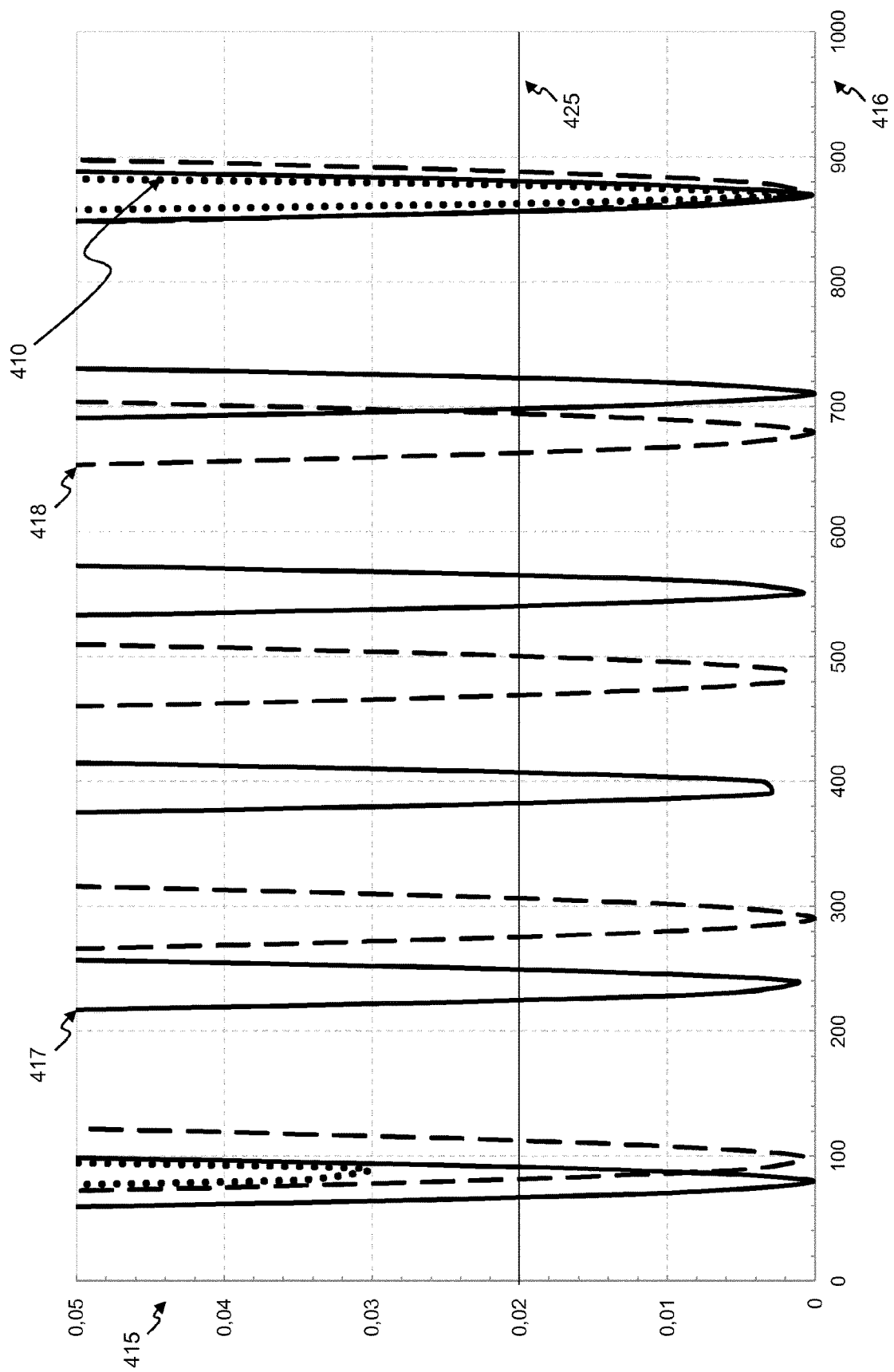
FIG. 10 schematically illustrates a measured intensity of reflected light corresponding to incident light comprising single wavelengths and a measured intensity of reflected light corresponding to incident light comprising two wavelengths, both as a function of a thickness of a layer being grown on a surface of a wafer.

FIG. 10 illustrates a zoom of FIG. 9 in the range of thicknesses from 0 nm to 1000 nm grown on a surface of a wafer being characterized by the system 1 according to the present invention. FIG. 10 therefore illustrates the reflected intensity 415 of reflected light as a function of a thickness 416 of a layer being grown on top of a surface of a wafer loaded onto a susceptor, for the in-situ determination of a curvature of the surface of the wafer using the system 1 according to the present invention. The plot 417 corresponds to the reflected intensity of reflected light corresponding to incident light as a single beam being reflected on the surface of the wafer, wherein the incident light comprises a single wavelength at 658 nm emitted by a laser source. The plot 418 corresponds to the reflected intensity of reflected light corresponding to incident light as a single beam being reflected on the surface of the wafer, wherein the incident light comprises a single wavelength at 808 nm emitted by a laser source different from the laser source emitting at 658 nm. The plot 410 corresponds to the reflected intensity of reflected light corresponding to the incident light as a single beam being reflected on the surface of the wafer, wherein the incident light comprises both wavelengths at 658 nm and at 808 nm, emitted by a multiwavelength light source module according to the present invention. The detection limit 425 of the deflection detector according to the present invention is plotted on FIG. 10. As can be seen in FIG. 10, there exist several thicknesses 416 of a layer being grown on top of a surface of a wafer for which the reflected intensity 415 of the plots 417 and 418 is close to zero, thereby rendering the determination of a curvature of a surface of a wafer at these thicknesses impossible due to the existence of destructive interferences for these wavelengths. Additionally, the thicknesses 416 of a layer being grown on top of a surface of a wafer for which the reflected intensity 415 is close to zero are different for each plot 417 and 418. With each plot 417 or 418, there exist several thicknesses 416 for which it is not possible to determine a curvature of the wafer because of the existence of destructive interferences for these plots 417 or 418. However, as it can be seen on FIG. 10, the number of layer thicknesses 416 which give destructive interferences is strongly reduced for the plot 410 which corresponds to incident light comprising both wavelengths at 658 nm and at 808 nm, thereby increasing the possibility of determining a curvature of the surface of the wafer.

Figure 11:
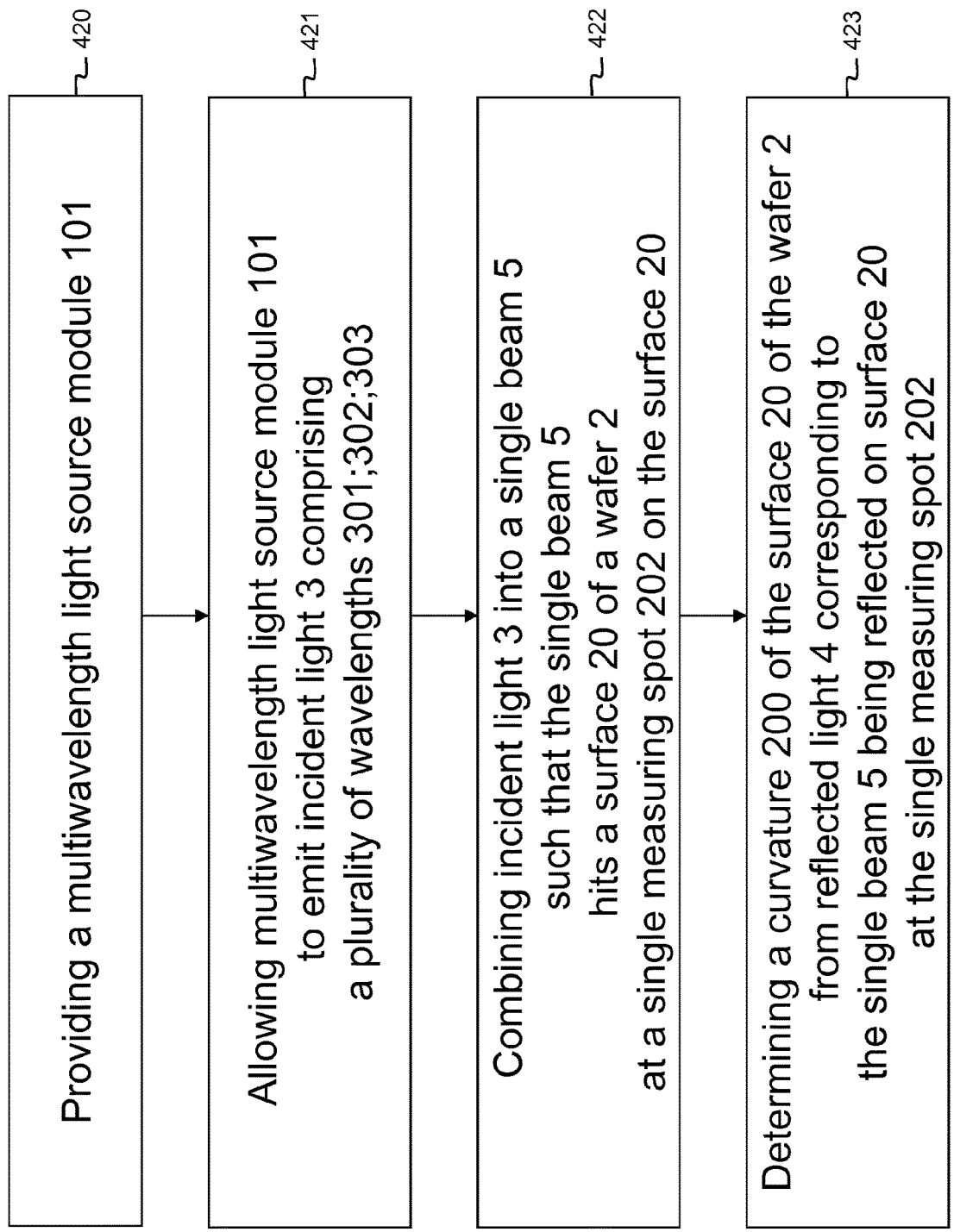
FIG. 11 schematically illustrates an embodiment of the steps of a method according to the present invention.

FIG. 11 schematically depicts the steps of a method according to the present invention for in-situ measurement of a curvature of a surface of a wafer. In step 420, a multiwavelength light source module 101 is provided. The multiwavelength light source module 101 then emits in step 421 incident light 3 comprising a plurality of wavelengths 301;302;303. In step 422, the incident light 3 is combined into a single beam 5 such that the single beam 5 hits a surface 20 of a wafer 2 at a single measuring spot 202 on the surface 20. In step 423, a curvature 200 of the surface 20 of the wafer 2 is then determined from reflected light 4 corresponding to the single beam 5 being reflected on the surface 20 of the wafer 2 at the single measuring spot 202.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A system for in-situ measurement of a curvature of a surface of a wafer, said system comprising:
 a multiwavelength light source module, adapted to emit incident light comprising a plurality of wavelengths;
 an optical setup configured to combine said incident light into a single beam and further configured to guide said single beam towards a surface of a wafer such that said single beam hits said surface at a single measuring spot on said surface;
 a curvature determining unit, configured to determine a curvature of said surface of said wafer from reflected light corresponding to said single beam being reflected on said surface at said single measuring spot;

a deflection detector, adapted to collect said reflected light corresponding to said single beam being reflected on the surface at the single measuring spot; and a susceptor, said wafer being loaded onto said susceptor;

wherein said susceptor rotates in a plane perpendicular to said single beam such that a susceptor rotation axis of said susceptor is parallel to said single beam;

wherein said curvature determining unit is further configured to determine a position of a single reflected spot formed by said reflected light on said deflection detector when said single beam reflects at the single measuring spot on the surface of said wafer;

wherein said curvature determining unit is further configured to determine said curvature of said surface of said wafer by fitting a deflection of said reflected light on said position detector at a single reflected spot as a function of a rotation angle of said susceptor.

2. The system according to claim 1, wherein said multiwavelength light source module comprises one or more of the following:
- two or more laser sources wherein at least two of said wavelengths are separated from each other by at least 5 nm;
- a white light source;
- a broadband light source.

3. The system according to claim 1, wherein at least two of said plurality of wavelengths are separated from each other by at least 5 nm.

4. The system according to claim 1, wherein said deflection detector comprises a position detector and wherein said position detector is positioned in said system such that said position is on said position detector.

5. The system according to claim 1, wherein said optical setup is further adapted to guide said single beam towards a surface of said wafer such that said single beam reflects on said surface of said wafer at a given radius from said susceptor rotation axis.

6. The system according to claim 4, wherein said system further comprises a susceptor and a plurality of wafers loaded onto said susceptor; and
wherein said susceptor rotates in a plane perpendicular to said incident light such that a susceptor rotation axis of said susceptor is parallel to said incident light.

7. The system according to claim 6, wherein said optical setup is further adapted to guide said single beam towards surfaces of said plurality of said wafers such that said single beam reflects on said surfaces of said plurality of wafers at a given radius from said susceptor rotation axis.

8. The system according to claim 6, wherein said curvature determining unit is further configured to determine said curvature of each of said surfaces of said plurality of wafers by deriving a deflection of said reflected light n said position detector as a function of a rotation angle of said susceptor.

9. The system according to claim 1, wherein said system further comprises a plurality of multiwavelength light source modules,
wherein each of said multiwavelength light source modules is adapted to emit one or more incident light beams,
wherein each of said one or more incident light beams comprises a plurality of wavelengths.

10. A method for in-situ measurement of a curvature of a surface of a wafer, said method comprising the steps of:
providing a multiwavelength light source module;
allowing said multiwavelength light source module to emit incident light comprising a plurality of wavelengths;
combining said incident light into a single beam;
providing a susceptor having said wafer loaded thereon, wherein said susceptor rotates in a plane perpendicular to said single beam such that a susceptor rotation axis of said susceptor is parallel to said single beam;
guiding said single beam towards a surface of said wafer such that said single beam hits the surface at a single measuring spot on said surface; and
determining a curvature of said surface of said wafer from reflected light corresponding to said single beam being reflected on said surface at said single measuring spot;
wherein said determining a curvature of said surface of said wafer corresponds to fitting a deflection of said reflected light on said position detector at a single reflected spot as a function of a rotation angle of said susceptor.

* * * * *